United States Patent
Sohn et al.

(10) Patent No.: US 9,500,727 B2
(45) Date of Patent: Nov. 22, 2016

(54) SYSTEM AND METHOD FOR CONTROL OF RF CIRCUITS FOR USE WITH AN MRI SYSTEM

(71) Applicants: Sung-Min Sohn, St Paul, MN (US);
John Thomas Vaughan, Jr., Stillwater, MN (US); Anand Gopinath, Wayzata, MN (US)

(72) Inventors: Sung-Min Sohn, St Paul, MN (US);
John Thomas Vaughan, Jr., Stillwater, MN (US); Anand Gopinath, Wayzata, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 668 days.

(21) Appl. No.: 13/868,014

(22) Filed: Apr. 22, 2013

(65) Prior Publication Data
US 2013/0285659 A1    Oct. 31, 2013

Related U.S. Application Data

(60) Provisional application No. 61/636,085, filed on Apr. 20, 2012.

(51) Int. Cl.
| | | |
|---|---|---|
| *G01V 3/00* | (2006.01) | |
| *G01R 33/34* | (2006.01) | |
| *G01R 33/54* | (2006.01) | |
| *G01R 33/345* | (2006.01) | |
| *G01R 33/36* | (2006.01) | |

(52) U.S. Cl.
CPC ..... *G01R 33/34092* (2013.01); *G01R 33/3456* (2013.01); *G01R 33/3628* (2013.01); *G01R 33/54* (2013.01)

(58) Field of Classification Search
CPC .................................................. G01R 33/3628
USPC .................................................. 324/318, 322
See application file for complete search history.

(56) References Cited

U.S. PATENT DOCUMENTS

| | | |
|---|---|---|
| 4,391,146 A | 7/1983 | Grindheim |
| 4,682,125 A | 7/1987 | Harrison et al. |
| 4,763,076 A | 8/1988 | Arakawa et al. |
| 4,881,034 A | 11/1989 | Kaufman et al. |
| 4,894,589 A | 1/1990 | Borowiec |
| 4,947,119 A | 8/1990 | Ugurbil et al. |
| 5,075,600 A | 12/1991 | El-Hamamsy et al. |

(Continued)

FOREIGN PATENT DOCUMENTS

| | | |
|---|---|---|
| CA | 2042145 A1 | 1/1992 |
| WO | 2005111645 A2 | 11/2005 |

(Continued)

OTHER PUBLICATIONS

Beck, et al., High Q Reactive Network for Automatic Impedance Matching, Proc. Intl. Soc. Mag. Reson. Med., 2011, 19:1853.

(Continued)

*Primary Examiner* — Louis Arana
(74) *Attorney, Agent, or Firm* — Quarles & Brady LLP

(57) ABSTRACT

A system and method for automatically adjusting electrical performance of a radio frequency (RF) coil assembly of a magnetic resonance imaging (MRI) system during a medical imaging process of a subject to control changes in loading conditions of the RF coil caused by the subject during the medical imaging process.

24 Claims, 14 Drawing Sheets

(56) References Cited

U.S. PATENT DOCUMENTS

| | | | |
|---|---|---|---|
| 5,304,930 A | 4/1994 | Crowley et al. | |
| 5,557,247 A | 9/1996 | Vaughn, Jr. | |
| 5,670,881 A * | 9/1997 | Arakawa et al. | 324/322 |
| 5,714,831 A | 2/1998 | Walker et al. | |
| 5,744,957 A | 4/1998 | Vaughan, Jr. | |
| 5,777,475 A * | 7/1998 | Vester | 324/322 |
| 5,886,596 A | 3/1999 | Vaughan, Jr. | |
| 5,908,386 A | 6/1999 | Ugurbil et al. | |
| 6,002,251 A | 12/1999 | Sun | |
| 6,181,131 B1 | 1/2001 | Bruland et al. | |
| 6,236,206 B1 | 5/2001 | Hartman et al. | |
| 6,495,069 B1 | 12/2002 | Lussey et al. | |
| 6,534,983 B1 | 3/2003 | Boskamp et al. | |
| 6,633,161 B1 | 10/2003 | Vaughan, Jr. | |
| 6,636,037 B1 | 10/2003 | Ou-Yang | |
| 6,636,414 B2 | 10/2003 | Obert et al. | |
| 6,650,116 B2 | 11/2003 | Garwood et al. | |
| 6,788,056 B2 | 9/2004 | Vaughan et al. | |
| 6,788,057 B1 | 9/2004 | Petropoulos et al. | |
| 6,788,058 B1 | 9/2004 | Petropoulos et al. | |
| 6,888,348 B2 | 5/2005 | Kupce | |
| 6,930,480 B1 | 8/2005 | Fujita et al. | |
| 6,946,840 B1 | 9/2005 | Zou et al. | |
| 6,958,607 B2 | 10/2005 | Vaughan et al. | |
| 6,969,992 B2 | 11/2005 | Vaughan et al. | |
| 6,975,115 B1 | 12/2005 | Fujita et al. | |
| 6,977,502 B1 | 12/2005 | Hertz | |
| 6,980,002 B1 | 12/2005 | Petropoulos et al. | |
| 7,023,209 B2 | 4/2006 | Zhang et al. | |
| 7,042,222 B2 | 5/2006 | Zheng et al. | |
| 7,084,631 B2 | 8/2006 | Qu et al. | |
| 7,088,104 B2 | 8/2006 | Bottomley | |
| 7,132,829 B2 | 11/2006 | Hudson et al. | |
| 7,268,554 B2 | 9/2007 | Vaughan | |
| 7,279,899 B2 | 10/2007 | Michaeli et al. | |
| 7,352,185 B1 | 4/2008 | Zens et al. | |
| 7,403,006 B2 | 7/2008 | Garwood et al. | |
| 7,436,103 B2 | 10/2008 | Kawakubo et al. | |
| 7,439,736 B2 | 10/2008 | Meaney et al. | |
| 7,514,926 B2 | 4/2009 | Adriany et al. | |
| 7,598,739 B2 | 10/2009 | Vaughan, Jr. et al. | |
| 7,633,293 B2 | 12/2009 | Olson et al. | |
| 7,672,650 B2 | 3/2010 | Sorrells et al. | |
| 7,701,209 B1 | 4/2010 | Green | |
| 7,710,117 B2 | 5/2010 | Vaughan et al. | |
| 7,777,484 B2 | 8/2010 | Garwood et al. | |
| 7,800,368 B2 | 9/2010 | Vaughan et al. | |
| 7,906,966 B1 | 3/2011 | Votruba | |
| 8,055,326 B1 | 11/2011 | Dworkin et al. | |
| 8,093,900 B2 | 1/2012 | Bennett | |
| 8,093,978 B2 | 1/2012 | Kawarai et al. | |
| 8,190,237 B2 | 5/2012 | Driemel | |
| 8,193,809 B2 | 6/2012 | Akgun et al. | |
| 8,198,895 B2 | 6/2012 | Iannotti et al. | |
| 8,217,653 B2 | 7/2012 | Vaughan | |
| 8,222,796 B2 | 7/2012 | Bhaskaran et al. | |
| 8,299,681 B2 | 10/2012 | Snyder et al. | |
| 8,334,697 B2 | 12/2012 | Overweg et al. | |
| 8,380,266 B2 | 2/2013 | Vaughan et al. | |
| 8,525,116 B2 | 9/2013 | Schulz et al. | |
| 8,604,791 B2 | 12/2013 | Vaughan, Jr. et al. | |
| 8,816,566 B2 | 8/2014 | Snyder, Jr. et al. | |
| 8,854,042 B2 | 10/2014 | Vaughan, Jr. et al. | |
| 8,981,774 B2 * | 3/2015 | Leussler | 324/307 |
| 9,024,636 B2 * | 5/2015 | Kozlov et al. | 324/322 |
| 2003/0119677 A1 | 6/2003 | Qiyan et al. | |
| 2003/0206019 A1 | 11/2003 | Boskamp | |
| 2005/0264291 A1 | 12/2005 | Vaughan et al. | |
| 2006/0001426 A1 | 1/2006 | Vaughan et al. | |
| 2006/0279284 A1 | 12/2006 | Vaughan | |
| 2008/0180101 A1 | 7/2008 | Bradshaw et al. | |
| 2008/0262339 A1 | 10/2008 | Garwood et al. | |
| 2009/0115417 A1 | 5/2009 | Akgun et al. | |
| 2009/0237077 A1 | 9/2009 | Vaughan | |
| 2009/0264733 A1 | 10/2009 | Corum et al. | |
| 2010/0147801 A1 | 6/2010 | Sago et al. | |
| 2013/0063319 A1 | 3/2013 | Snyder, Jr. et al. | |
| 2015/0077117 A1 | 3/2015 | Snyder et al. | |
| 2015/0123660 A1 * | 5/2015 | Vaughan et al. | 324/314 |

FOREIGN PATENT DOCUMENTS

| | | |
|---|---|---|
| WO | 2006014260 A2 | 2/2006 |
| WO | 2006121949 A1 | 11/2006 |
| WO | 2008064365 A2 | 5/2008 |
| WO | 2010045457 A2 | 4/2010 |

OTHER PUBLICATIONS

De Mingo, et al., An RF Electronically Controlled Impedance Tuning Network Design and Its Application to an Antenna Input Impedance Automatic Matching System, IEEE Transactions on Microwave Theory and Techniques, 2004, 52(2):489-497.

Firrao, et al., An Automatic Antenna Tuning System Using Only RF Signal Amplitudes, IEEE Transactions on Circuits and Systems—II. Express Briefs, 2008, 55(9):833-837.

Gu, et al., A New Method for Matching Network Adaptive Control, IEEE Transactions on Microwave Theory and Techniques, 2013, 61(1):587-595.

Hoarau, et al., Complete Design and Measurement Methodology for a Tunable RF Impedance-Matching Network, IEEE Transactions on Microwave Theory and Techniques, 2008, 56(11):2620-2627.

Hwang, et al., Automatic Probe Tuning and Matching, Mag. Reson. Med., 1998, 39:214-222.

Ibrahim, et al., Effect of RF Coil Excitation on Field Inhomogeneity at Ultra High Fields: A Field Optimized TEM Resonator, Magnetic Resonance Imaging, 2001, 19:1339-1347.

Idiyatullin, et al., Continuous SWIFT, Journal of Magnetic Resonance, 2012, 220:26-31.

Kaya, et al., Design of a New Impedance Tuning Network by Using RC Mutator, Microwave and Optical Technology Letters, 2007, 49(2):298-302.

Meng, et al., A Mismatch Detector for Adaptive Antenna Impedance Matching, Proceedings of the 36th European Microwave Conference, 2006, pp. 1457-1460.

Nemati, et al., Design of Varactor-Based Tunable Matching Networks for Dynamic Load Modulation of High Power Amplifiers, IEEE Transactions on Microwave Theory and Techniques, 2009, 57(5):1110-1118.

Qiao, et al., Antenna Impedance Mismatch Measurement and Correction for Adaptive CDMA Transceivers, Microwave Symposium Digest, 2005, IEEE MTT-S International, pp. 783-786.

Sankey, Adaptive Tuning for Handheld Transmitters, Microwave Symposium Digest, 2009, MTT '09, IEEE MTT-S International, pp. 225-228.

Sohn, et al., Auto-Tuning of the RF Transmission Line Coil for High-Fields Magnetic Resonance Imaging (MRI) Systems, Microwave Symposium Digest (MTT), 2011 IEEE MTT-S International, pp. 1-4.

Sohn, et al., Automatically Tuned and Matched RF Transceive Head Coil at 7T, Proc. Intl. Soc. Mag. Reson. Med., 2014, 22:0318.

Sohn, et al., (Pi)-Matching Technique for RF Coil of MRI Systems, Microwave Symposium Digest (MTT), 2012 IEEE MTT-S International, pp. 1-3.

Song, et al., A CMOS Adaptive Antenna-Impedance-Tuning IC Operating in the 850MHz-to-2GHz Band, 2009 IEEE International Solid-State Circuits Conference, Session 22, PA and Antenna Interface, 22.6, 3 pages.

Song, et al., A Mixed-Signal Matching State Search Based Adaptive Antenna Tuning IC, IEEE Microwave and Wireless Components Letters, 2010, 20(10):581-583.

Vaughan, et al., RF Image Optimization at 7T & 9.4T, Proc. Intl. Soc. Mag. Reson. Med., 2005, 13:953.

Vaughan, et al., 9.4T Human MRI: Preliminary Results, Magnetic Resonance in Medicine, 2006, 56:1274-1282.

(56) References Cited

OTHER PUBLICATIONS

Venook, et al., Automatic Tuning of Flexible Interventional RF Receiver Coils, Magnetic Resonance in Medicine, 2005, 54:983-993.
Whatley, et al., Reconfigurable RF Impedance Tuner for Match Control in Broadband Wireless Devices, IEEE Transactions on Antennas and Propagation, 2006, 54(2):470-478.
Cho, et al., Noninvasive Measurements of Transmural Myocardial Metabolites Using 3-D 31P NMR Spectroscopy, Am. J. Physiol. Heart Circ. Physiol., 2001, 280:H489-H497.
Nelder, et al., A Simplex Method for Function Minimization, The Comp. J., 1965, 7:308-313.
Sung, et al., B1+ Compensation in 3T Cardiac Imaging Using Short 2DRF Pulses, Magnetic Resonance in Medicine, 2008, 59:441-446.
Vaughan, et al., Clinical Imaging at 7T With a 16 Channel Whole Body Coil and 32 Receive Channels, Proc. Intl. Soc. Mag. Reson. Med., 2009, 17:392.

* cited by examiner

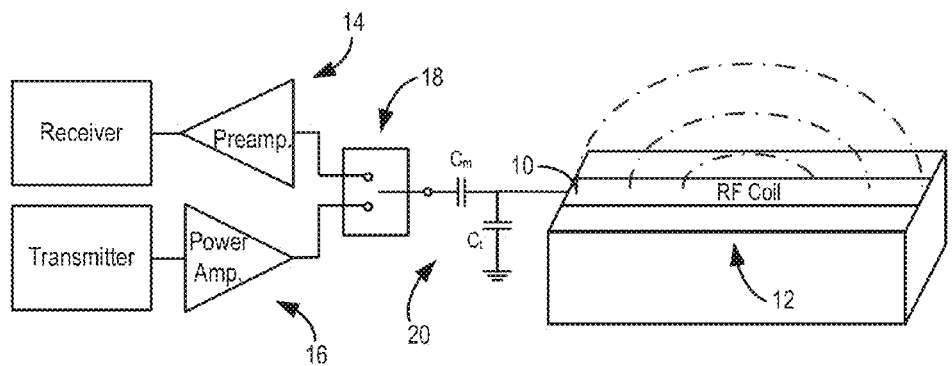
FIG. 1A
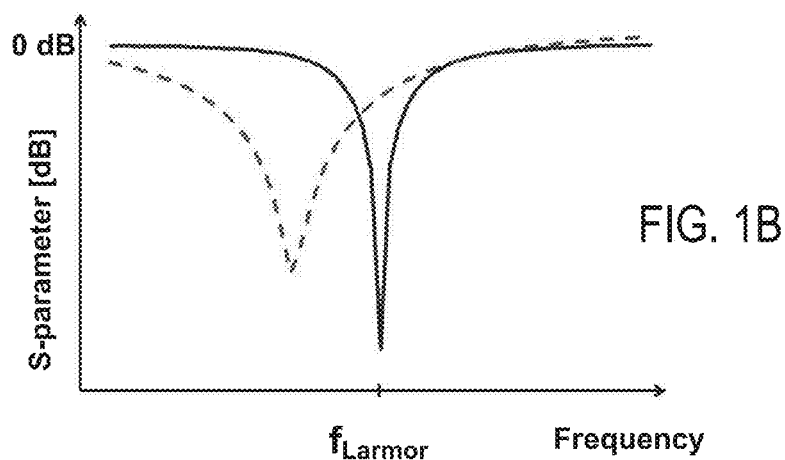
FIG. 1B
FIG. 5

SYSTEM AND METHOD FOR CONTROL OF RF CIRCUITS FOR USE WITH AN MRI SYSTEM

CROSS REFERENCE TO RELATED APPLICATIONS

This application is based on, claims priority to, and incorporates herein by reference in its entirety U.S. Provisional Application Ser. No. 61/636,085, filed Apr. 20, 2012, and entitled "SYSTEM AND METHOD FOR AUTOMATIC TUNING OF RF COIL CIRCUITS FOR USE WITH AN MRI SYSTEM."

STATEMENT REGARDING FEDERALLY FUNDED RESEARCH

N/A.

BACKGROUND OF THE INVENTION

The field of the invention relates to systems and methods for magnetic resonance imaging ("MRI"). More particularly, the present invention relates to systems and methods controlling a radio frequency (RF) circuit for use with an MRI system.

When a substance such as human tissue is subjected to a uniform magnetic field (polarizing field $B_0$) applied along, for example, a z axis of a Cartesian coordinate system, the individual magnetic moments of the spins in the tissue attempt to align with this polarizing field, but process about it in random order at their characteristic Larmor frequency. If the substance, or tissue, is subjected to a magnetic field (excitation field $B_1$) that is in the x-y plane and that is near the Larmor frequency, the net aligned moment, Mz, may be rotated, or "tipped", into the x-y plane to produce a net transverse magnetic moment $M_t$. A NMR signal is emitted by the excited spins after the excitation signal $B_1$ is terminated, this signal may be received and processed to form an image or produce a spectrum.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Radio frequency antennas, or coils are used to produce the excitation field $B_1$ and other RF magnetic fields in the subject being examined. Such coils are also used to receive the relatively weak NMR signals that are produced in the subject. Such coils may be so-called "whole body" coils that are large enough to produce a magnetic field for a human subject or, they can be much smaller "local" coils that are designed for specific clinical applications such as head imaging, knee imaging, wrist imaging, and the like. Local coils may be either volume coils or surface coils.

The aforementioned polarizing magnetic field is a common metric upon which standard systems are differentiated. Standard magnetic field strengths include 1.5 Tesla (T), 3 T, as well as those of lesser and greater strength. Increased magnetic field strength brings better signal-to-noise ratio (SNR), higher resolution, and improved contrast and, therefore, experimental system use ultra-high-fields of 7 T, 9.4 T and 11.74 T.

MR Imaging at higher magnetic fields strengths, including the above-referenced ultra-high-fields, presents certain challenges in RF coil circuit design. The common RF transverse electromagnetic (TEM) coil design has widely used microstrip transmission line as elements that inductively couple to the human anatomy at Larmor frequencies of up to 500 MHz (11.74 T). As used herein RF coil, RF antenna, microstrip, and the like all refer generally to electrical elements or "RF elements" and are used herein. As shown in FIG. 1A, the general RF structure for an MRI system is illustrated and includes an RF coil element 10 on a dielectric substrate 12, for example Teflon, wireless receiver components 14, wireless transmitter components 16, an RF switch 18, and capacitors 20.

RF coils 10 for use with a microstrip line provide advantages, including distributed coil circuit, high sensitivity due to high Q, and relatively-simple structure. However, this high sensitivity also creates a critical disadvantage in the form of a loading (body) effect. As illustrated in FIG. 1B, the resonance frequency and quality factor (Q) are changed from location 22 to location 24 due to impedance mismatch when different human body weight, shape, and tissue composition are loaded. As illustrated, resonance frequency shifts down from the Larmor frequency determined by the strength of magnetic field ($B_0$) because of the coupling between RF coil and human anatomy.

The loading effect needs to be taken into consideration by way of a tuning procedure after the body comes into the MRI scanner and it is unpredictable. In general, referring again to FIG. 1A, tuning of the RF coil system entails adjusting the capacitors 20. A first capacitor is called the matching capacitor ($C_m$) connected in series and another capacitor called the tuning capacitor ($C_t$) connected in parallel. The matching capacitor $C_m$ matches the impedance of the RF coil together with the effects of human anatomy to the source and power amplifiers. The tuning capacitor $C_t$ holds the resonance frequency (which is the Larmor frequency) of the RF coil element, which is determined by the magnetic field strength ($B_0$) by:

$$\omega_0 = \gamma \times B_0, \qquad \text{Eqn. (1)}$$
$$\left(\gamma = \frac{42.58 \text{ MHz}}{\text{Tesla}}\right).$$

In current practice essentially all coils operating in transmit, receive, and transceiver modes in MRI applications operate in fixed tuned and fixed impedance matched conditions. The isolation between coil elements, between transmit and receive coils, or modes is also fixed. Coils are designed, manufactured, and used to be "one size fits all". However all human body loads to which coils are applied are not the same size, are not the same shape, are not in the same position and, therefore, do not present the same electrical load to the fixed coils. Because these coils with fixed tune, match, and isolation conditions cannot be adjusted by any existing practical means, suboptimal coil performance is the consequence. Reflected power lost to impedance mismatch, attenuated power lost to off-resonance transmission and reception, field distortions, and power loss to coil-to-coil and T/R mode coupling (lack of isolation) renders images with lower signal-to noise ratios, lower homogeneity, more RF artifacts, and higher specific absorption rates.

These problems have been tolerated at lower field strengths, such as 1.5 T and below, because the longer wavelengths for the Lower Larmor frequencies produce fields with stronger penetration and higher uniformity, attributes which compensate somewhat for the problems of ignoring coil tuning, matching and isolation. However at higher $B_0$ fields and $B_1$ frequencies, coil tuning and matching becomes more critical for the reasons given above. And while, at lower frequencies, single monolithic resonators can be used to generate uniform excitation fields, safe and successful images at higher fields increasingly benefit from multi-channel transmit, receive, and transceiver coils. Multichannel coils give the ability to adjust the $B_1$ field in any or all of the phase, magnitude, frequency, space, or time domains to facilitate $B_1$ field optimization over a field of interest. Each channel of a multi-channel coil must be tuned, matched, and isolated. Also, each channel should, ideally, be tuned, matched, and isolated per patient or other load. That is, it would be beneficial if each channel were tuned, matched, and/or isolated for each patient, or, even better, be tuned, matched and/or isolated dynamically to track patients' movements over the imaging process, be it course physical movements of the body, or be it breathing, heartbeat, or other physiological motion. Given that receivers of up to 64 channels and transmitters of up to 16 channels are being delivered with MRI systems today, manual adjustment of tune, match, and/or isolation capacitances per channel is impractical for either clinical or research applications. That is, practically speaking, to make such adjustments, the operator of the MRI scanner would need to adjust the capacitances of these capacitors 20 by hand. It is a major obstacle to the application of these coils to the MRI system.

Therefore, it would be desirable to have a system and method for providing and operating an RF system within an MR imaging process that does not require cumbersome tuning, matching, and adjustments thereto that varying substantially with operational characteristics of the MR system and the subject being imaged.

SUMMARY OF THE INVENTION

The present invention overcomes the aforementioned drawbacks by providing a system and method for tuning, matching, and/or isolating a radio frequency (RF) system for use in an MRI system. Such control may include electronically adjusting, even without the need to manually intervene, the resonance frequency, impedance matching, transmit-receive isolation, and the like of a loaded RF circuit. In some configurations, the system and method can detect operational variables, such as changes due to loading conditions, and automatically tune circuitry associated with the RF coil to compensate for the detected operational variables.

In accordance with one aspect of the invention, a method for automatically tuning a radio frequency (RF) element for use with a magnetic resonance imaging (MRI) system is provided. The method includes measuring a reflected signal of the RF coil, determining an adjusted condition, and adjusting at least one reactive component based on the adjusted condition. Components may refer to individual circuit elements or circuits themselves.

In accordance with another aspect of the present invention, a radio-frequency (RF) system is disclosed for use with a magnetic resonance imaging (MRI) system during a imaging process of a subject. The RF system includes a radio frequency (RF) element configured to at least one of transmit RF energy to and receive RF energy from the subject during the medical imaging process and an array of reactive components coupled to the RF element and configured to adjust at least one of an impedance transformation and a frequency tuning associated with the RF element. The RF system also includes a mismatch detector circuit configured to measure a reflected signal from the RF element and a feedback circuit configured to receive an indication of the reflected signal from the mismatch detector circuit and automatically determine at least one of an impedance adjustment and a frequency tuning to be implemented by adjusting the array of reactive components based on the reflected signal.

In accordance with yet another aspect of the invention, a method is disclosed for automatically controlling operation of a radio frequency (RF) element for use with a magnetic resonance imaging (MRI) system. The method includes the steps of (a) determining at least one of a frequency tuning need and an impedance matching mismatch and (b) determining a desired performance of the RF element to be achieved by reducing the at least one of a frequency tuning need and an impedance matching mismatch. The method also includes (c) adjusting at least one reactive component coupled to the RF element to reduce the at least one of frequency tuning need and impedance matching mismatch based on the desired performance of the RF coil element and (d) repeating step (c) during an MRI process using the RF coil element to control the at least one of frequency tuning need and impedance matching mismatch based on the desired performance of the RF element despite loading condition changes during the MRI process.

In accordance with still another aspect of the invention, a system is disclosed for automatically adjusting electrical performance of a radio frequency (RF) system of a magnetic resonance imaging (MRI) system during a medical imaging process of a subject. The system includes an adjustment circuit coupled between the MRI system and the RF system and a frequency detector circuit configured to measure a resonance frequency from the RF system. The system also includes a feedback circuit configured to receive an indication of the resonance frequency from the frequency detector circuit and determine at least one of a frequency tuning need and a impedance matching mismatch using the resonance frequency and a control circuit configured to control operation of the adjustment circuit to implement at least one of frequency tuning adjustments and impedance matching adjustments to control changes in the resonance frequency at least caused by changes in loading conditions of the RF system caused by the subject during the medical imaging process.

In accordance with yet another aspect of the invention, a radio-frequency (RF) system is disclosed for use with a magnetic resonance imaging (MRI) system during a imaging process of a subject. The RF system includes a radio frequency (RF) element configured to at least one of transmit RF energy to and receive RF energy from the subject during the medical imaging process, an array of reactive components coupled to the RF element, and a diode system configured to adjust parameters of the reactive components to perform at least one of an impedance matching and a frequency tuning of the RF element. The system also includes a control circuit configured to control the diode system to adjust parameters of the reactive components.

The foregoing and other advantages of the invention will appear from the following description. In the description, reference is made to the accompanying drawings which form a part hereof, and in which there is shown by way of illustration embodiments of the invention. Such embodiments do not necessarily represent the full scope of the invention, however, and reference is made therefore to the claims and herein for interpreting the scope of the invention.

BRIEF DESCRIPTION OF THE DRAWINGS

FIG. 1A is a schematic representation of a traditional radio frequency (RF) coil system for use with an magnetic resonance (MR) system to performing an imaging process.

FIG. 1B is a graph illustrating the loading effect on RF coil systems such as illustrated in FIG. 1A.

FIG. 5 is a simplified model of a subsection of the system of FIG. 4.

DESCRIPTION OF THE INVENTION

Figure 2:
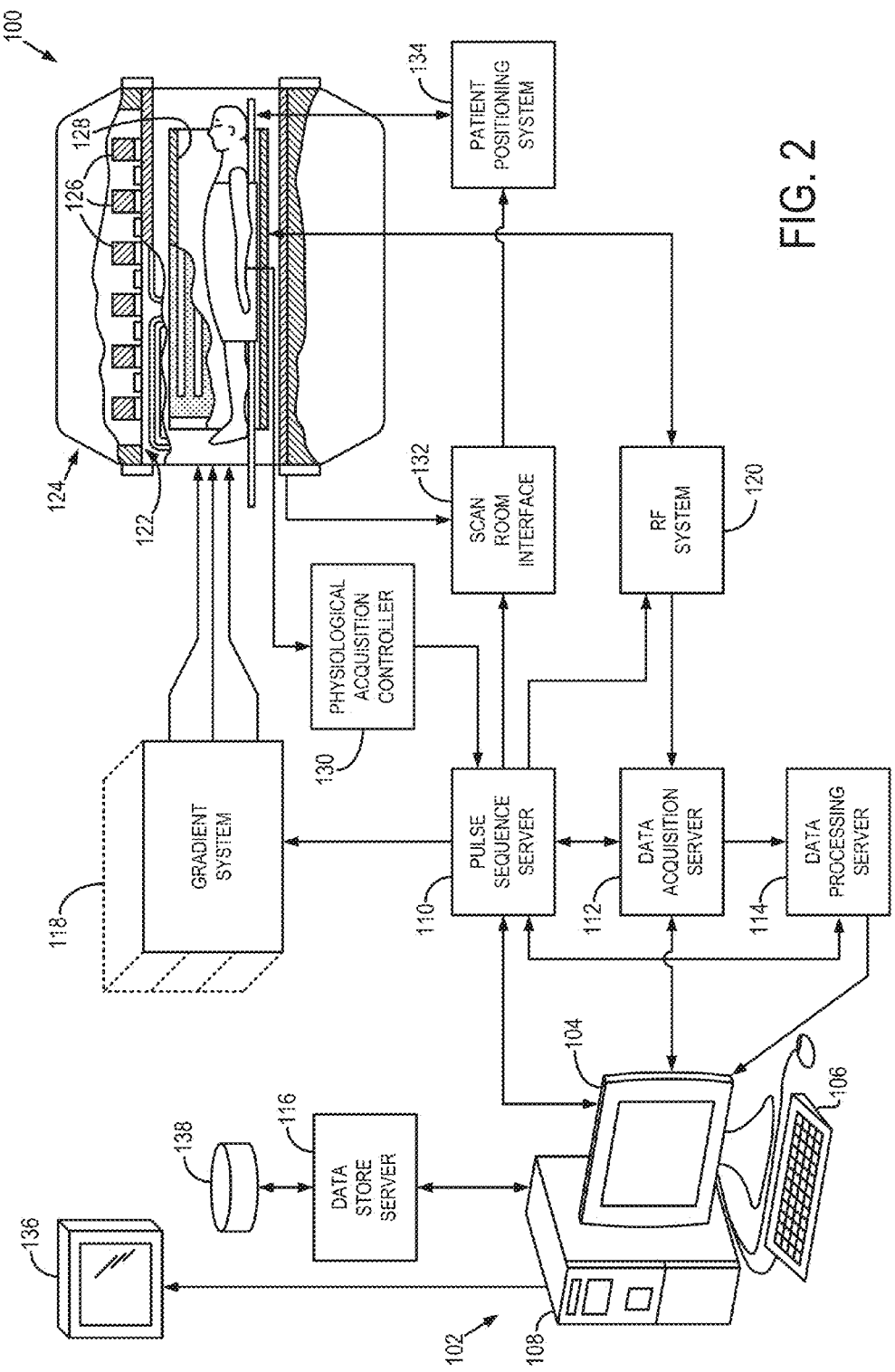
FIG. 2 is a block diagram of an exemplary magnetic resonance imaging ("MRI") system for use with the present invention.

Referring particularly now to FIG. 2, an example of a magnetic resonance imaging ("MRI") system 100 is illustrated. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients, and used for position encoding MR signals. The gradient coil assembly 122 forms part of a magnet assembly 124 that includes a polarizing magnet 126 and a whole-body RF coil 128.

RF waveforms are applied to the RF coil 128, or a separate local coil (not shown in FIG. 2), by the RF system 120 to perform the prescribed magnetic resonance pulse sequence. Responsive MR signals detected by the RF coil 128, or a separate local coil (not shown in FIG. 2), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 2).

The RF system 120 also includes one or more RF receiver channels. Each RF receiver channel includes an RF preamplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the and components:

$$M = \sqrt{I^2 + Q^2} \qquad \text{Eqn. (2);}$$

and the phase of the received MR signal may also be determined:

$$\varphi = \tan^{-1}\left(\frac{Q}{I}\right). \qquad \text{Eqn. (3)}$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. By way of example, the data acquisition server 112 acquires MR data and processes it in real-time to produce information that may be used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 2), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

Figure 3:
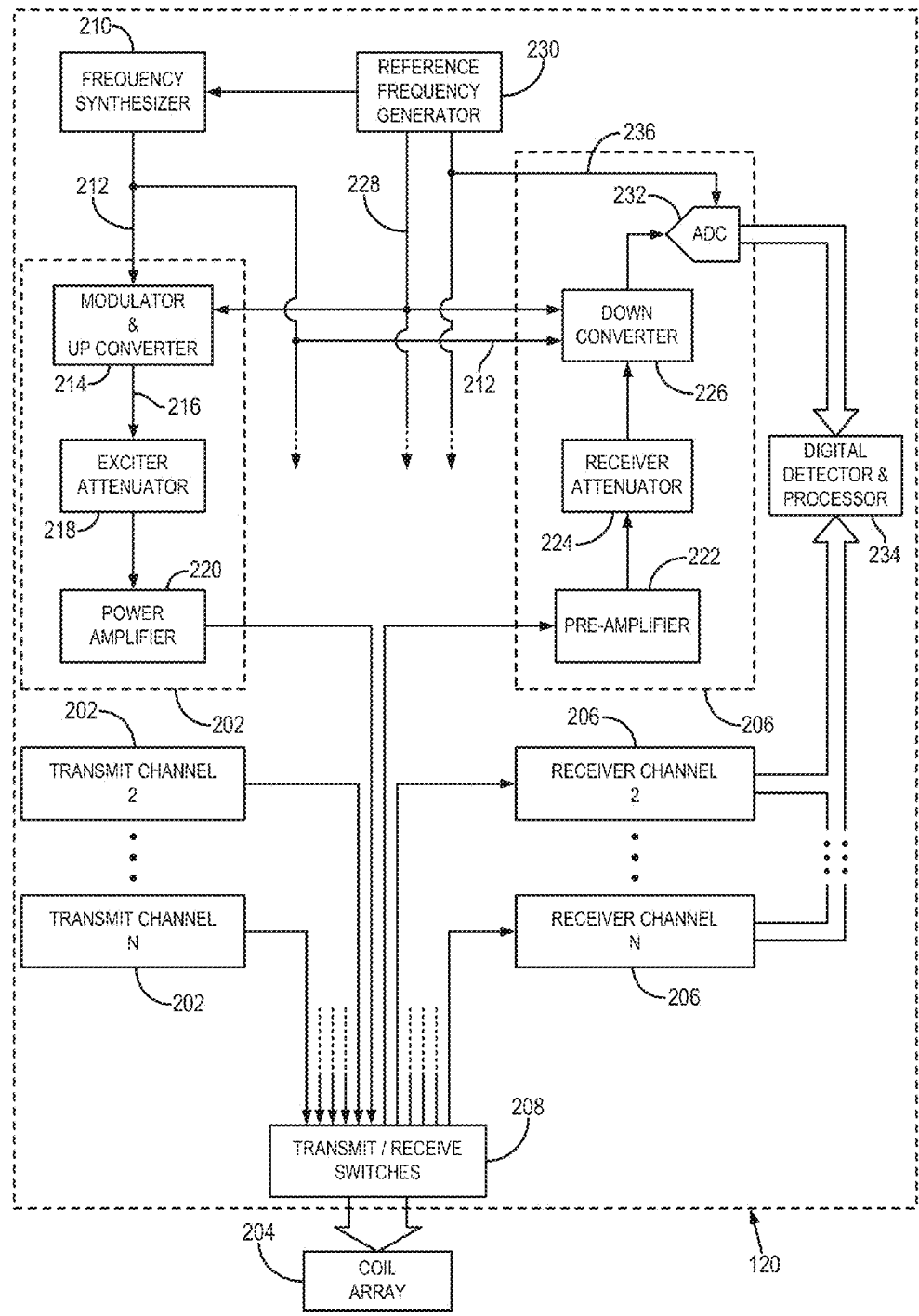
FIG. 3 is a block diagram of an example of a radio frequency ("RF") system that may form part of the MRI system of FIG. 2.

As shown in FIG. 2, the radiofrequency ("RF") system 120 may be connected to the whole body RF coil 128, or, as shown in FIG. 3, a transmission section of the RF system 120 may connect to one or more transmit channels 202 of an RF coil array 204 and a receiver section of the RF system 120 may connect to one or more receiver channels 206 of the RF coil array 204. The transmit channels 202 and the receiver channels 206 are connected to the RF coil array 204 by way of one or more transmit/receive ("T/R") switches 208. Though illustrated as having multiple transmit channels 202 and multiple receiver channels 206 connected to multiple transmit/receive switches 208, the present invention is not limited to traditional or parallel imaging systems. Also, the receiver channel 206 may also be an assembly of coils separate from the transmit coil array. In such a configuration, the T/R switches 208 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 3, the RF system 120 includes one or more transmit channels 202 that produce a prescribed RF electromagnetic field. The base, or carrier, frequency of this RF field is produced under control of a frequency synthesizer 210 that receives a set of digital signals from the pulse sequence server 110. These digital signals indicate the frequency, amplitude, and phase of the RF carrier signal produced at an output 212. The RF carrier is applied to a modulator and, if necessary, an up converter 214 where its amplitude and phase is modulated in response to a signal, R(t), also received from the pulse sequence server 110. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 216 is attenuated by an attenuator circuit 218 that receives a digital command from the pulse sequence server 110. The phase of the RF pulse may also be altered using phase shifters (not shown). The modulated RF pulses are then applied to a power amplifier 220 that drives one element of the RF coil array 204, or several such elements that are electrically coupled. Multiple transmit channels then drive other elements of the multichannel transmit coil array.

The MR signal produced by the subject is picked up by the RF coil array 202 and applied to the inputs of the set of receiver channels 206. A preamplifier 222 in each receiver channel 206 amplifies the signal, which is then attenuated, if necessary, by a receiver attenuator 224 by an amount determined by a digital attenuation signal received from the pulse sequence server 110. The received signal is at or around the Larmor frequency, and this high frequency signal may be down converted in a two step process by a down converter 226. In an example of such a process, the down converter 226 first mixes the MR signal with the carrier signal on line 212 and then mixes the resulting difference signal with a reference signal on line 228 that is produced by a reference frequency generator 230. The MR signal is applied to the input of an analog-to-digital ("A/D") converter 232 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal may then be applied to a digital detector and signal processor 234 that produces in-phase (I) and quadrature (Q) values corresponding to the received signal. The resulting stream of digitized I and Q values of the received signal are output to the data acquisition server 112. In addition to generating the reference signal on line 228, the reference frequency generator 230 also generates a sampling signal on line 236 that is applied to the ND converter 232.

The above-described RF coils can be formed using transmission line elements. One example of such a transmission line element is a microstrip line and, as will be described, such microstrip lines can be advantageously utilized with the present invention. However, other elements may be likewise utilized, such as strip lines, coaxial cable, and the like.

The fundamental resonance frequency of a single microstrip resonator can be modeled by:

$$\text{Resonance frequency } (f) = \frac{c}{2 \times L \sqrt{\varepsilon_{\textit{eff}}}}; \qquad \text{Eqn. (4)}$$

where c is the speed of light in free space, L is the physical length of the microstrip element and $\varepsilon_{\textit{eff}}$ is the effective dielectric constant of the microstrip line. Therefore, the one important parameter in determining the microstrip resonance frequency is L, which is inversely proportional of f.

Figure 4:
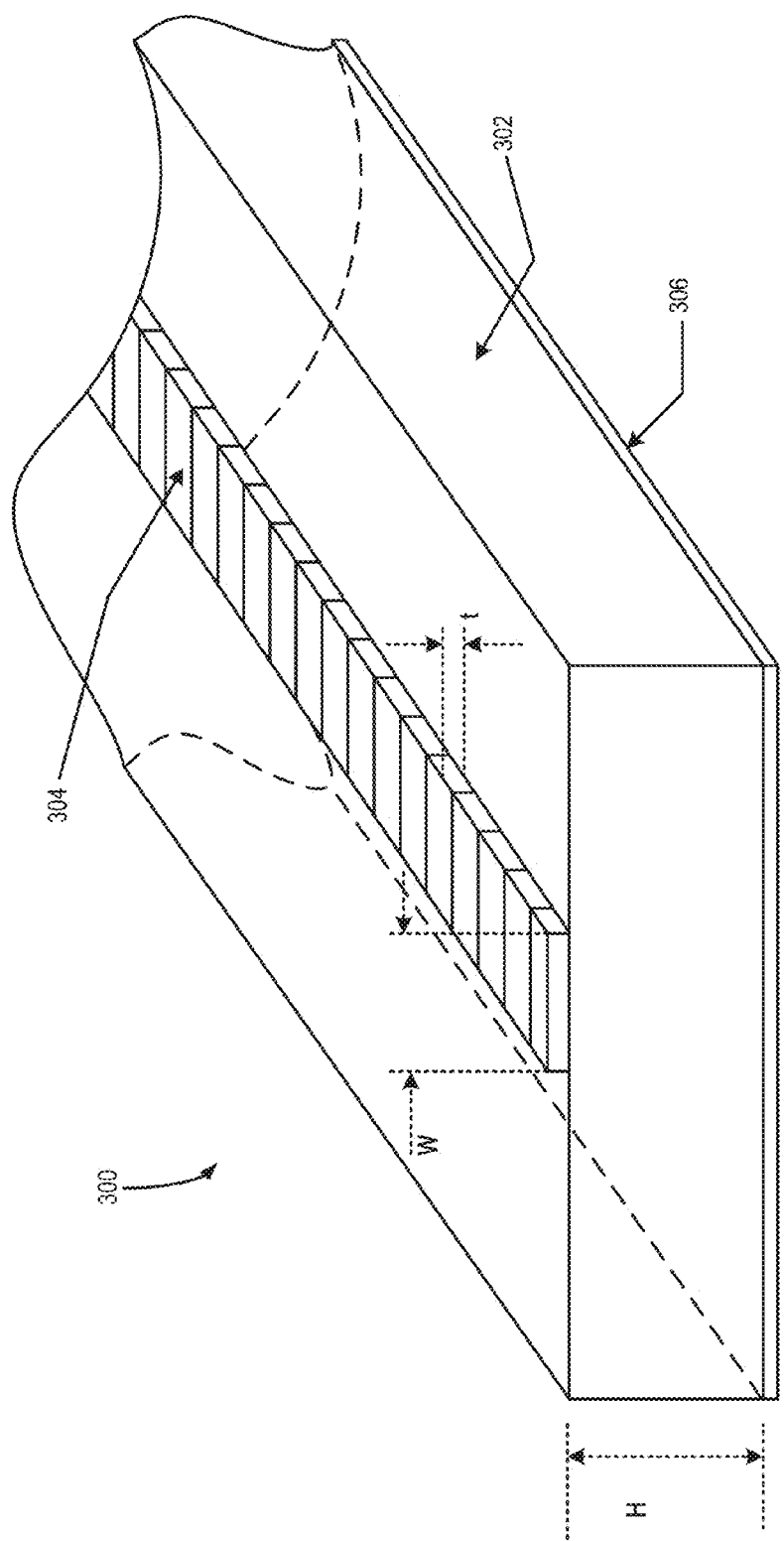
FIG. 4 is a partial, perspective view of an RF antenna system in accordance with the present invention.

The characteristics of a single microstrip resonator can be described as follows. Referring to FIG. 4, a microstrip line coil 300 can be formed by a low-loss dielectric substrate ($\varepsilon_r$) 302 between a microstrip line 304 and a ground plane 306, where h is the height between the microstrip line 304 and ground plane 306 and w is the width of microstrip line 304. A simplified model of microstrip line 304 depicted in FIG. 4 is illustrated in FIG. 5, where $Z_0$ and β are the characteristic impedance and propagation constant, respectively, of the microstrip line 304. Due to its specific semi-open transmission line structure, substantial electromagnetic energy is stored in the area near the strip conductor line. This results in reduced radiation losses and preserving current uniformity in circuits exceeding one tenth the wavelength of its carrier signal at high fields. A rule of thumb for any resonant circuit in the electronics industry is: "when circuit length exceeds 0.1λ, use a transmission line."

The characteristic impedance, $Z_0$, and propagation constant, β, of microstrip line 304 resonator element can be calculated as follows:

$$\epsilon_{\mathit{eff}} = \begin{bmatrix} \frac{\varepsilon_r+1}{2} + \\ \frac{\varepsilon_r-1}{2}\left[\frac{1}{\sqrt{1+12\left(\frac{W}{H}\right)}} + 0.04\left(1-\frac{W}{H}\right)^2\right] & \text{if } \frac{W}{H} < 1 \\ \frac{\varepsilon_r+1}{2} + \frac{\varepsilon_r-1}{2}\left(1+\frac{12H}{W}\right)^{-0.5} & \text{otherwise} \end{bmatrix}; \quad \text{Eqn. (5)}$$

and $$Z_0 = \frac{Z_f}{2\pi\sqrt{\varepsilon_{\mathit{eff}}}}\ln\!\left(8\frac{H}{W}+\frac{W}{4H}\right), \quad \text{Eqn. (6)}$$

where $Z_f = \sqrt{\frac{\mu_0}{\varepsilon_0}} = 376.8\,\Omega$, in free space. The system 300 has asymmetric structure between the microstrip line 304 and ground plane 306 as shown in FIG. 4. Therefore, the effective dielectric constant, $\epsilon_{\mathit{eff}}$, of the system 300 instead of the relative dielectric constant, $\epsilon_r$, of the substrate has to be considered in characterizing different parameters related to the microstrip resonance element. The expression of effective dielectric constant and the characteristic impedance in the unloaded case is given by Eqns. 5 and 6, above.

If there is a distributed capacitive load on the microstrip line system for a shorter length of microstrip line, the characteristic impedance and other parameters should be modified as:

$$Z_{0\_capacitive\_loading} := \frac{Z_0}{CF}; \quad \text{Eqn. (7)}$$

where $$CF := \sqrt{1+\frac{C_f}{(C_0 \cdot L_{\mathit{eff}})}}\,; \quad \text{Eqn. (8)}$$

$$C_0 := \frac{2.6378 \cdot 10^{-11} \cdot (\varepsilon_{\mathit{eff}} + 1.41)}{\ln\!\left(\frac{5.98 \cdot H}{0.8 \cdot W + t}\right)}; \quad \text{Eqn. (9)}$$

$$L_{\mathit{eff}} = L + 2\Delta L_m \quad \text{Eqn. (10)}$$

and $$\Delta L_m := 0.412 \cdot H \cdot \frac{(\varepsilon_{\mathit{eff}} + 0.3)\left(\frac{W}{H}+0.264\right)}{(\varepsilon_{\mathit{eff}} - 0.258)\left(\frac{W}{H}+0.8\right)}. \quad \text{Eqn. (11)}$$

That is, CF is a correction factor according to capacitance loaded, $C_f$, capacitance of microstrip line per unit length, $C_0$, and the effective length, $L_{\mathit{eff}}$, considered fringing effect. If $\lambda_0$ is the free-space wavelength, the wavelength of the wave component along the microstrip is given by:

$$\lambda = \frac{\lambda_0}{\sqrt{\varepsilon_{\mathit{eff}}}}. \quad \text{Eqn. (12)}$$

In the RF coil design, a TEM resonator is useful and has the best B1 field distribution if the length of the microstrip line is closing to the half-wavelength. When the half-wavelength TEM resonator element has open-circuit terminations, the maximum voltage occurs at the ends and the maximum current occurs at the center of the microstrip line. This length, however, is impractical to build a practical RF coil. Therefore, a capacitive termination method can be used to reduce the electric length resulting in the reduction of a practical size of a TEM resonator, and it also provides more uniform B1 field distribution. The input impedance of the capacitively terminated microstrip resonator is given by:

$$Z_{in} = \frac{Z_{C_1} Z_0 (Z_{C_2} + jZ_0\tan(\beta l))}{Z_0(Z_{C_1} + Z_{C_1}) + j(Z_{C_1} Z_{C_2} + Z_0^2)\tan(\beta l))}; \quad \text{Eqn. (13)}$$

Where $\beta=(2\pi/\lambda)$ is the phase constant, l is the length of the microstrip line, $Z_0$ is the characteristic impedance of the microstrip line, $Z_{C_1}$ is $1/j\omega C_1$, and $Z_{C_2}$ is $1/j\omega C_2$.

To meet the resonance condition ($Z_{in} \to \infty$), a denominator should become an infinite. In case both capacitances are identical ($C=C_1=C_2$), the capacitance value can be derived from equation 13, such that:

$$C = \frac{\cos(\beta l)+1}{\omega_0 Z_0 \sin(\beta l)}. \quad \text{Eqn. (14)}$$

From equation (14), a tuning capacitor value can be estimated when the dimensions of the microstrip line associated with β, l, and $Z_0$ are first fixed.

The impedance matching and frequency tuning of resonator element of an RF coil based on microstrip line can be described as follows. The use of a terms "matching" and "tuning" is often confused, or the terms are used interchangeably. As follows hereafter, "matching" refers to impedance matching, and "tuning" refers to frequency tuning in the RF coil analysis.

The roles of the impedance matching is to deliver the maximum power from a source (power amplifier) to a load (RF coil) for RF transmitting, and improve the signal-to-noise (SNR) from a load (RF coil) to a receiver (Low noise pre-amplifier) during RF receiving. In addition, the impedance matching can protect RF devices (passive and active elements, e.g. capacitors or RF T/R switch circuits) from the reflected high RF power (typical a few Watt range in RF coils) that builds standing waves containing the phase and amplitude (i.e. voltage or current). The amplitude of waves can be either subtracted or added due to the different phases. If the standing wave with the maximum of amplitudes is positioned and applied to a certain device, the device may be destroyed.

The frequency tuning is for adjusting the resonance frequency rather than the impedance matching. The process of this frequency tuning may affect the impedance matching condition, but the impact is certainly lower than the one of the impedance matching process.

Figure 6:
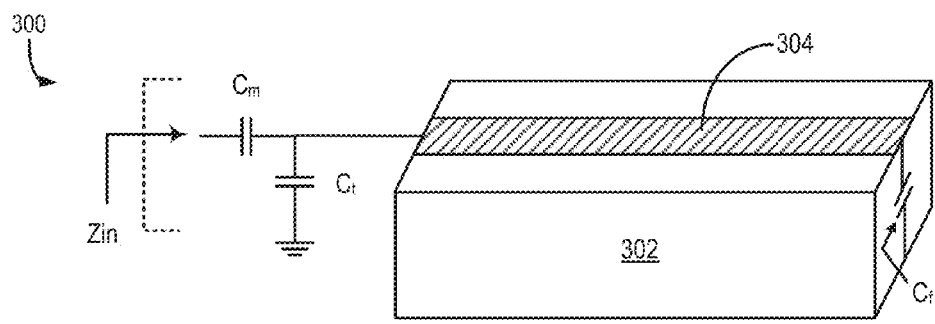
FIG. 6 is a schematic illustration of a RF coil system in accordance with the present invention.
Figure 7A:
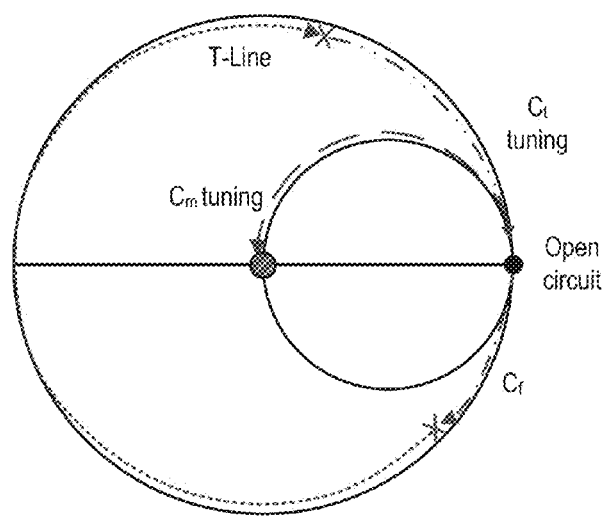
FIGS. 7A and 7B are Smith charts showing an open circuit state associated with the system of FIG. 6 and a mismatched region from the different impedance on Smith chart results from various characteristics of human anatomies and reflection coefficients that have resonance frequencies, respectively.
Figure 7B:
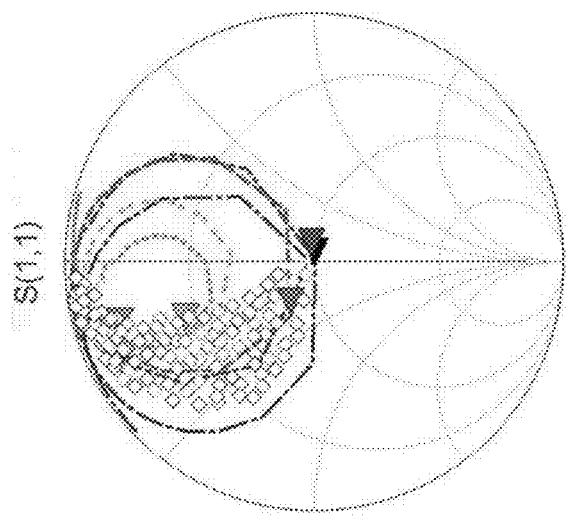

Referring to FIG. 6, the microstrip element 304 may be connected to a total of three capacitors, including a matching capacitor ($C_m$), a tuning capacitor ($C_t$), and a capacitor with fixed capacitance ($C_f$) for reducing size of microstrip line 304. With these capacitors and as will be described in further detail, impedance matching is achieved as illustrated the Smith chart from open circuit state, as illustrated in FIG. 7A. Referring to FIGS. 6-7B, the input impedance ($Z_{in}$) of RF coil element 300 including the matching capacitor ($C_m$) and tuning capacitors ($C_t$) may preferably be placed on the center of Smith chart for impedance matching. The trace of impedance rotates about two third of outer circle from open status with almost lossless property and a fixed value capacitor, $C_f$, takes a share of this trace. In practice, a starting point for impedance matching may be determined by the results of impedance of the combination of both the fixed capacitance ($C_f$) value and the physical length of microstrip line 304 with the characteristic impedance. The well-chosen value of tuning capacitor ($C_t$) moves input impedance to unit circle along outer circle, R=0, and then impedance travels unity circle by that of matching capacitor ($C_m$) toward the center of the Smith chart.

However, the input impedance ($Z_{in}$) of RF coil 300 changes when human anatomy enters the MRI scanner and a portion of the human anatomy is arranged proximate to the microstrip line 304. Specifically, the RF coil 300 inductively or capacitively couples with the human anatomy, which lowers the resonant frequency of the RF coil element 300. FIG. 7B illustrates the mismatched region from the different impedance on Smith chart results from various characteristics of human anatomies and reflection coefficients that have resonance frequencies, which corresponds to a drop in Qs.

Experimental results showing matched and mismatched reflection coefficients illustrate that the body loading effect seriously reduces the ability of power transfer and causes the RF coil to fail to excite the human anatomy to the level anticipated by the clinician using the prescribed pulse sequence. As a result, in clinical practice, the images are degraded. To compensate, the operator of the MRI scanner should tune capacitances of matching and tuning capacitors ($C_m$ and $C_t$); however, this process remains a major obstacle to the application of these coils to varied MRI systems and particularly to ultra-high-field MRI systems.

Figure 8:
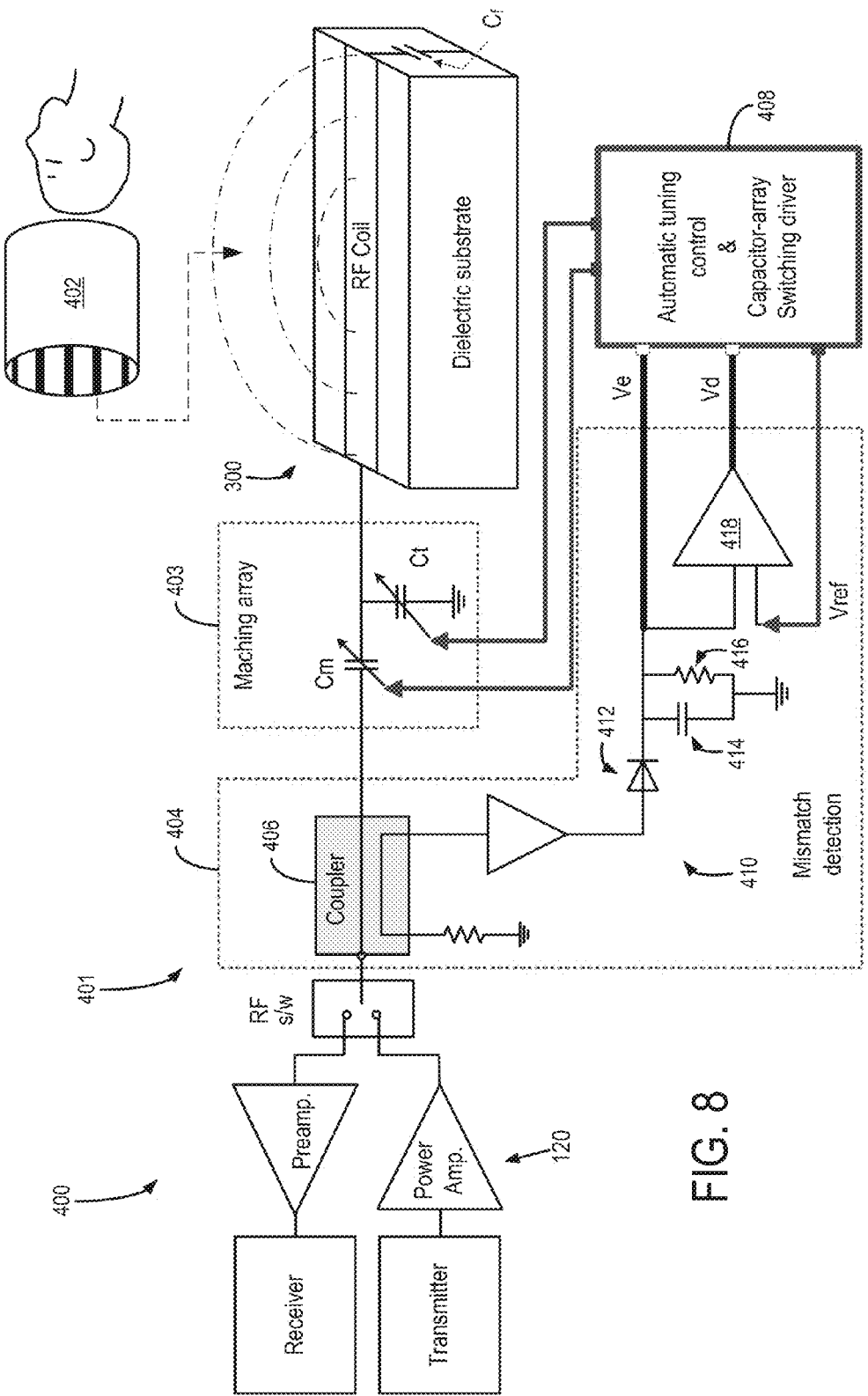
FIG. 8 is a schematic diagram of an example of an RF coil and automatic tuning system in accordance with the present invention.

Referring to FIG. 8, the present invention provides an automatic tuning structure. Specifically, FIG. 8 provides a schematic illustration of an example configuration of an automatic tuning system 400 in accordance with the present invention that includes a matching network 401. As illustrated, the above-described RF coil element 300 may form one part of a multi-channel RF coil 402, such as a multi-channel head coil. Such multi-channel head coil may commonly have 8 channels and may have more or less channels. The following components of the matching network 401 may be formed into an array of detection/tuning sub-systems, for example, such that each channel of the coil 402 is automatically tuned.

The system 400 includes an array of reactive components that form a matching array 403. As illustrated, the reactive components may include an electrically controlled capacitor array. However, the reactive components may be inductive components in combination with our instead of such capacitive components. That is, as one of ordinary skill in the art will appreciate, reactive components or elements may be represented by capacitive components or elements, inductive components or elements, combinations thereof, and/or combinations of capacitors, inductors, and other components. Thus, reference to capacitors, likewise, can be construed to represent reactive components and, thereby, inductive components.

The system 400 also includes a mismatch detection circuit 404 using an RF directional coupler 406 and an automatic tuning control and reactive-array switching driver block 408. The directional coupler 406 provides the capability of sensing the reflected signal, such as reflected power, in RF signal path. The reflected signal coupled from the main RF signal path is amplified and converted to a constant voltage level by an envelope detector 410, that includes PIN diodes 412, a capacitor (or inductor) 414, and a resistor 416. A reference voltage (Vref) is determined and fixed at an output of the envelope detector 410 under initial matched condition and the difference between this reference voltage (Vref) and the loaded output of the envelope detector 410 is generated in an operational amplifier 418. It is noted that the envelope detector 410 that is to measure the reflected signal, such a reflected power, can be replaced with the general power detector integrated circuits available in the commercial market. Eventually, the difference output becomes large as the impedance moves away from the center of Smith chart. The output of the mismatch detection block 404 may be an analog signal depending on load (human body) characteristics and is converted to the digital domain to compare and determine the optimal capacitances (and/or inductances) of the matching array block 403 in the automatic tuning control block 408. In the automatic tuning control block 408, the measured mismatch information may be processed to compare with current values and previous values. For example, the automatic tuning control bock 408 may include a reactance-array switching driver to turn on or off in each branch among the capacitor (and/or inductor) arrays and this driver may be designed to apply to the MRI system under high RF power, for example, 1 KW, switching. For example, the driver may be designed to meet the specification of −30V to turn off one branch in the capacitor (and/or inductor) array to decrease the capacitances (or inductances) and the driver generates over 200 mA to turn on one branch in reactance-array to increase capacitances.

Within this exemplary architecture or other architectures or configurations (both digital and analog), the automatic tuning algorithm of the present invention can operate as will be described. That is, while an exemplary circuit design and configuration is described, it is contemplated that the present tuning algorithm may be performed using various hardware configurations. However, the following description will be made with initial reference to the exemplary configuration provided with respect to FIG. 8.

Figure 9A:
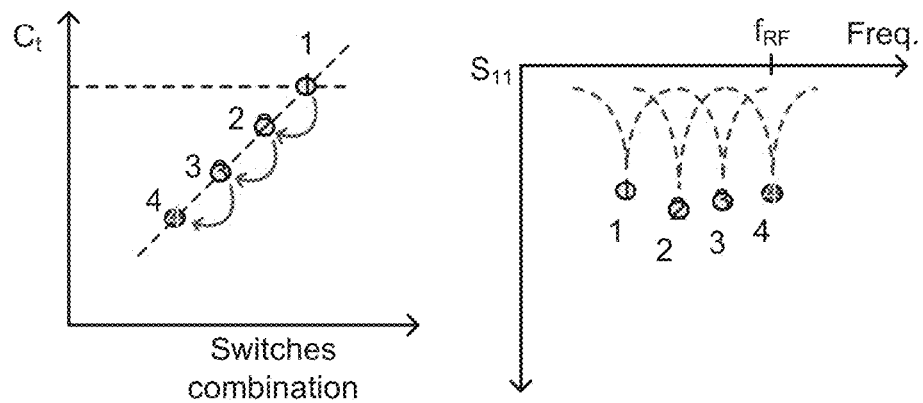
FIGS. 9A and 9B are graphs illustrating matching and tuning processes in accordance with the present invention.
Figure 9B:
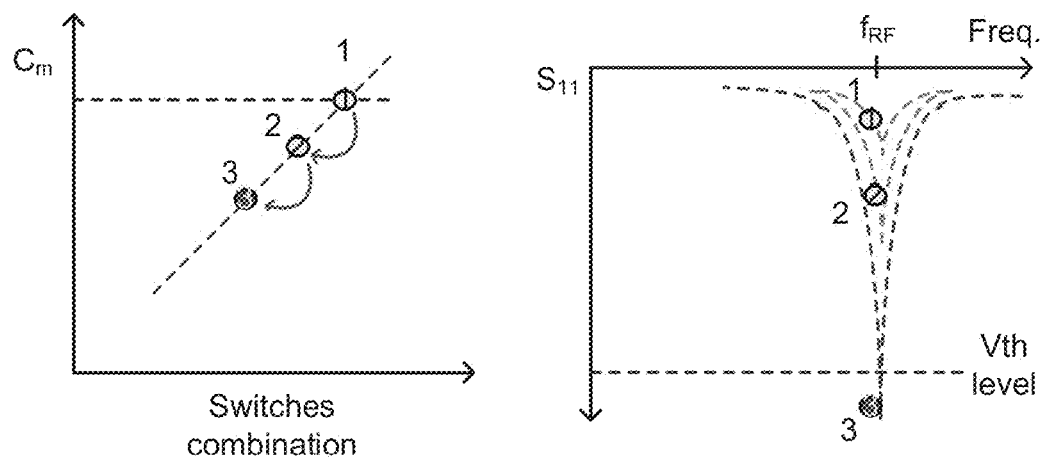

The operation of impedance tuning using traditional tuning schemes has two capacitances to tune, $C_t$ and $C_m$. Within this structure, from initial unloaded matching conditions, the purpose of $C_t$ tuning is to match the resonance frequency to Larmor frequency as automatic tuning control block 408 decreases capacitance using switch combination capacitors in the matching array block 4. Referring to FIG. 9A, this matching step alone does not create the overall matching condition although the resonance frequency of the RF coil element is at the Larmor frequency. The $C_t$ value is determined by the automatic tuning control block 408 during $C_t$ the tuning step and $C_m$ is tuned, as shown in FIG. 9B for fine tuning. Adjusting $C_m$ cannot much change the resonance frequency, only the amplitude of the reflection coefficient is sharply changed. This means that $C_m$ tuning is useful for fine tuning the impedance point on the Smith chart, and moves it to the center after $C_m$ tuning moves it from away the center to the nearby center.

FIG. 6 and associated description provides an inductance matching network circuit with, for example, two capacitors representing the reactance components. As described with respect to FIGS. 7A and 7B, the input impedance (Zin) of the RF coil element including matching (Cm) and tuning (Ct) capacitors should be placed on the center of Smith chart for the impedance matching. The trace of impedance rotates about two third of outer circle from the open status with almost lossless property, and a fixed value capacitor (Cf) takes a share of this trace. As also described, there are two different dominant functions (tuning and matching), and two processes are not independent. However, both effects can be seen as the same in the reflection coefficient, but a degree of the influence is significantly different.

As also described above with respect to FIGS. 9A and 9B, it is clear that the adjustment of the tuning capacitor (Ct) has priority because the error in the tuning capacitor's manipulation can detrimentally influence the process. There are various configurations to build matching network circuits. An L matching network, in general, is popular in the RF coil design. Two capacitors are employed. One dominantly plays a role in the impedance matching process, and another is in charge of the tuning process. A discrete inductor element is barely used in RF coil designs due to the loss and radiation issues. This simple L matching network successfully has accomplished the matching and tuning in the existing RF coils, but it can be problematic when additional functions are desired.

As such, a microstrip Pi matching network can be used to reduce the physical size and increase the performance supporting reactance arrays of the above-described automatic matching and tuning unit. Before describing the integration of a Pi matching circuit with the reactance arrays, the fundamentals of Pi matching circuit without reactance arrays can be considered.

Figure 10:
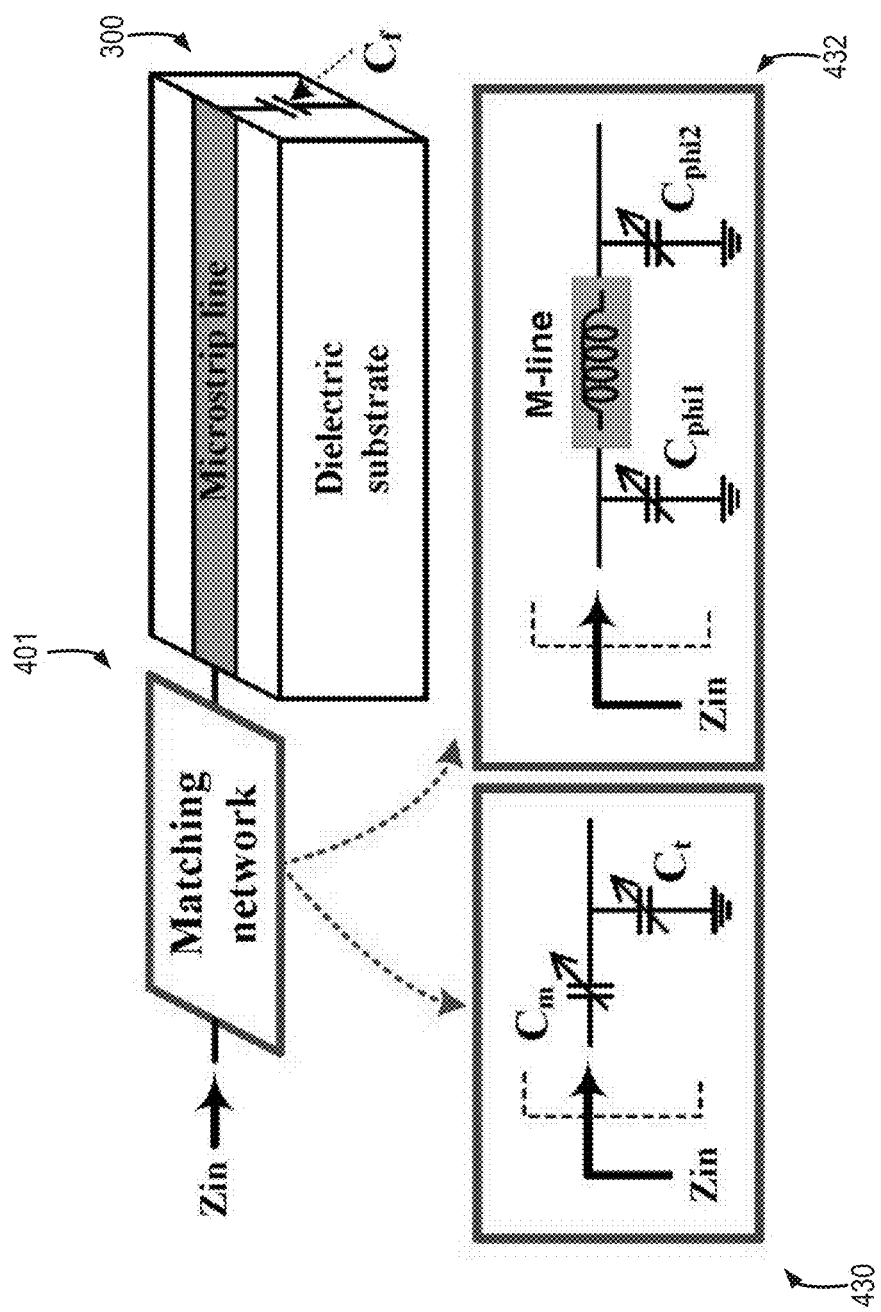
FIG. 10 is a schematic diagram illustrating two options for matching networks in accordance with the present invention.

Referring to FIG. 10, as described above, each element in a multi-channel coil can be viewed as a half-wavelength transmission line 300, fore-shortened by adding capacitors shunt in the form of capacitor $C_f$ and the matching network 401. The matching network 401 may be created by a variety of specific circuit configurations. For example, as described above and as illustrated by a first circuit 430, the RF coil element 300 is terminated to the two trimmer capacitors, the matching capacitor ($C_m$) and tuning capacitor ($C_t$), at one end and the fixed value capacitor ($C_f$) at the other end. This creates a distributed LC resonant circuit whose natural frequency can be adjusted with the trimmer capacitors to accommodate changes in the loading of the microstrip line by the sample, the human body.

However, a second, Pi matching circuit 432 may be used that includes two capacitors ($C_{phi1}$ and $C_{phi2}$) connected to ground in parallel and microstrip line (M-line) between the capacitors ($C_{phi1}$ and $C_{phi2}$) to obtain a desired inductance. As mentioned the Pi matching circuit 432 can be advantageously applied when additional functions are required because L matching for adding function blocks like capacitor (and/or inductor) arrays for the auto-tuning and matching become bulky and large losses experienced in the main signal path. That is, as illustrated in FIG. 11A, the signal path from "Input" to "Output" of the first circuit 430 can become unwieldy as additional functionality is added to the circuit design. Since the substrate has relatively high loss tangent (δ), in the range of, for example, δ=0.0021, in dielectric material, the microstrip line is also lossy. However, series connected components (e.g. capacitors and/or inductors and PIN diodes) on a microstrip line can be a more significant loss and impedance mismatch term in a RF resonant circuit. Equivalent series resistance (ESR) of capacitors and/inductors used in the illustrated design is about 0.3Ω to 0.5Ω. Because the quality factor (Q) of capacitors is smaller, and equivalent series resistance becomes larger as the operating frequency is higher, the series connected capacitor is disadvantageous at higher operating frequencies. The size and physical construction of a capacitor also may disturb the electromagnetic field distribution on a transmission line as to cause an impedance bump or impedance mismatch at that point.

This, and the series resistance internal to the capacitor, changes the impedance of the line at the input to the capacitor. Moreover, the range of capacitances of a series connection in L-matching is about 1 pF to 5 pF generally. This is an unfavorably small range of values to implement the capacitor array due to parasitic capacitances and inductances.

Figure 11B:
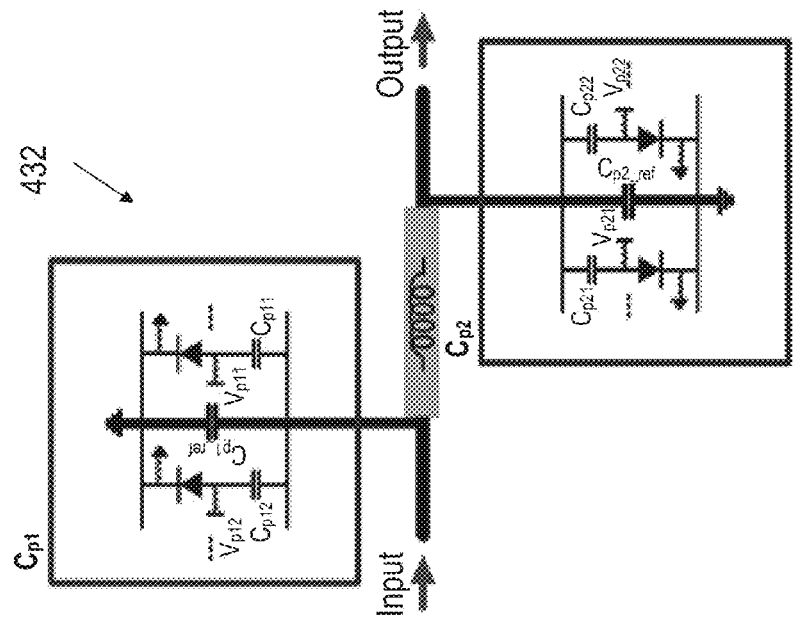
FIG. 11B is a schematic diagram of matching and tuning network applied capacitor array using a Pi network.
Figure 11A:
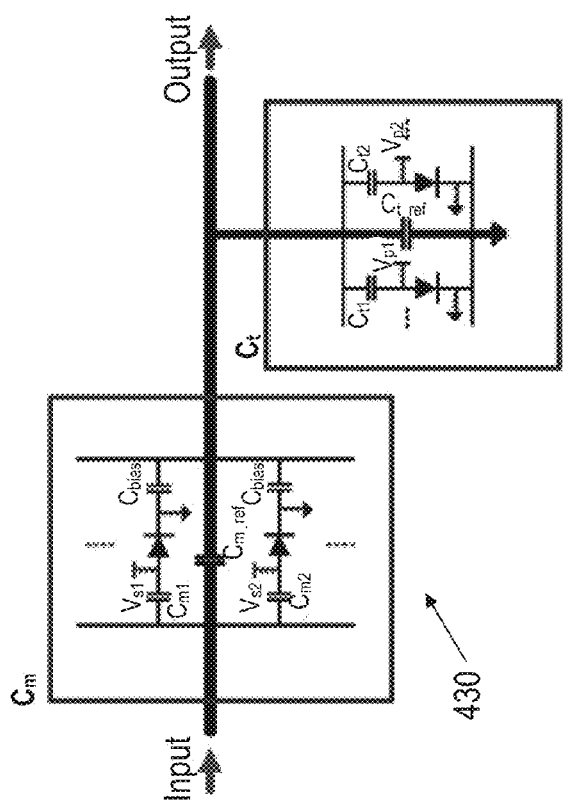
FIG. 11A is a schematic diagram of matching and tuning network applied capacitor array using an L network.

On the other hand, as illustrated in FIG. 11B, the signal path from "Input" to "Output" of the Pi matching circuit 432, however, doesn't have any component on the main signal line, so it can reduce the physical size from the signal input to output. Therefore, there is not any impedance bump or connection loss in the microstrip Pi matching network circuits.

Figure 12A:
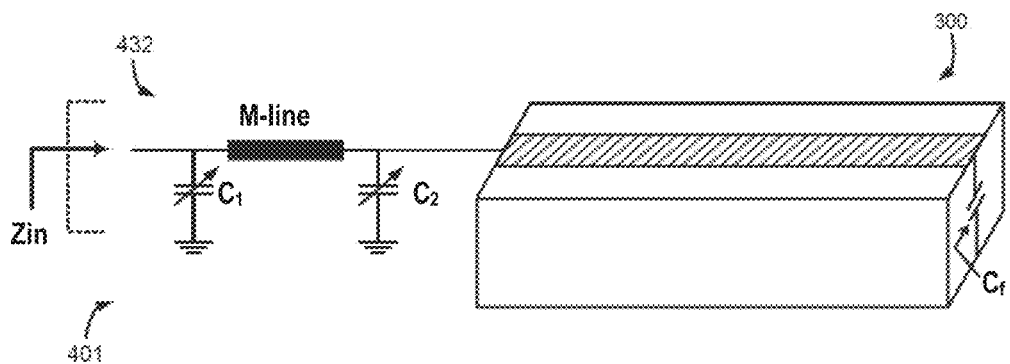
FIG. 12A is a schematic diagram of a Pi network in a matching network coupled to a RF coil element.
Figure 12B:
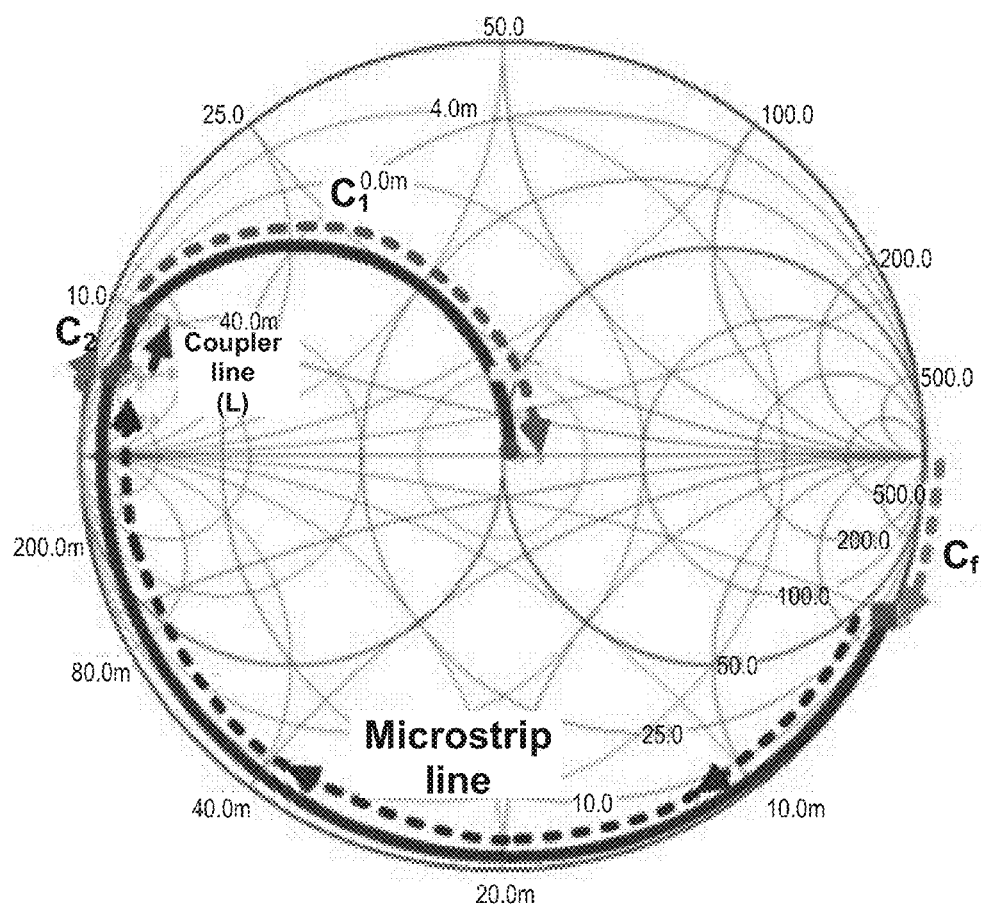
FIG. 12B Smith chart illustrating impedance matching and tuning steps for use with the system of FIG. 12A.

Referring to FIG. 12A, a coil element 300 and matching network 401 is illustrated, where the matching network 401 includes the Pi matching circuit 432. FIG. 12B shows a Smith chart illustrating the steps of impedance matching and tuning using the matching network 401 including the Pi matching circuit 432. Capacitor values were calculated as well as the dimensions of microstrip line that will serve as an inductor in this Pi matching network 432 are directly dependent on the choice of the dimensions of the microstrip resonator element. The Pi matching network can significantly reduce sheath current compared to L matching network due to the balanced circuit configuration, thereby, making it easier to adjust matching and tuning capacitances when a load is changed.

Figure 13:
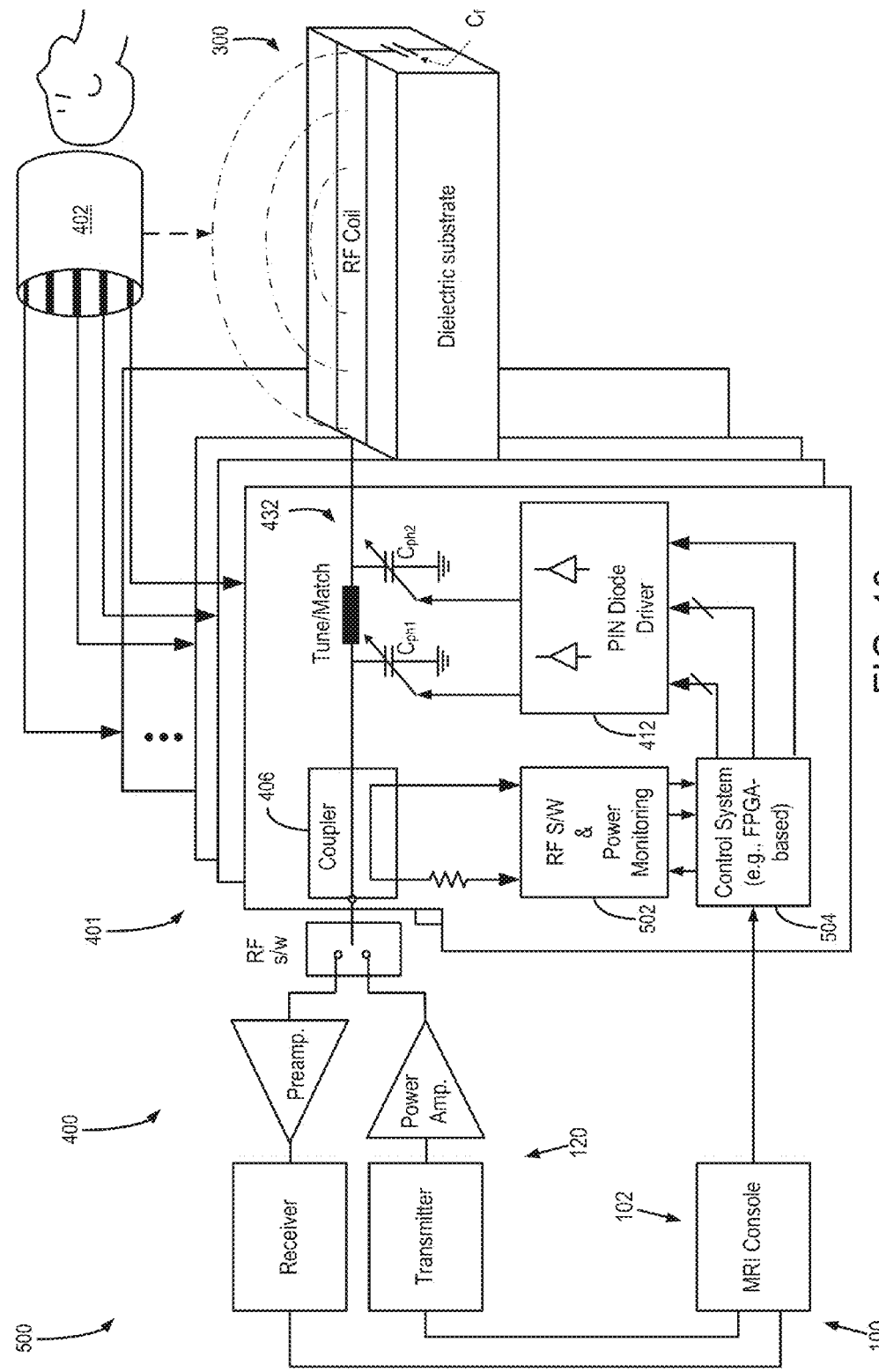
FIG. 13 is a schematic diagram with the automatic matching and tuning unit supporting a multi-channel RF coil.

Referring to FIG. 13, the above-described systems can be incorporated into a fully electric controlled stand-alone system 500 for automatic frequency tuning and impedance matching of the RF coil. This system 500 includes the RF coupler 406, the Pi matching circuit 432 with PIN diode/driver 412, an RF switch and power detector 502, and an FPGA-based control system 504 coupled between the RF coil 402 and the MRI system 100, such as the console 102 and RF system 120.

Referring to the PIN diode driver 412, switches that control the path of the RF high power for MRI applications (64 MHz~500 MHz) are the most common application of PIN diodes. PIN diodes are three layer diodes, formed of a heavily doped P-type layer (anode) and a heavily doped N-type layer (cathode) separated by a virtually undoped intrinsic layer. Under forward bias, charge carriers from the P and the N layers are forced into the intrinsic layer, which reduces its RF impedance. When a reverse bias, voltage bias is applied across the PIN diodes, all free charge carriers are removed from the intrinsic layer, thereby causing its RF impedance to increase. This variable RF impedance versus DC bias allows the diode to be used in RF switching circuits, in which the PIN diode is either heavily forward-biased or reverse-biased. Therefore, the PIN diode is essentially a variable resistor. A simple PIN diode switch circuit can provide reasonably low insertion loss ($I_L$) depending on the series resistance ($R_S$) of the PIN diode. This is one of the issues in the RF coil design with electrically controlled reactance array because many PIN diodes are used, and the overall loss must be controlled. Another contribution of PIN diodes is high isolation (ISO) property in the reverse bias state. It keeps the constant capacitances and/or inductances according to the combination of the PIN diode switches to turn on or off capacitor and/or inductor branches. Overall, the maximum RF power rate considered as the limiting factor is defined by:

$$I_L = 20\log\left(1 + \frac{R_s}{2Z_0}\right),$$
$$I_{SO} = 10\log\left(1 + \frac{1}{(4\pi f C_t Z_0)^2}\right)$$
$$P_d = \left(\frac{4R_S Z_0}{(2Z_0 + R)}\right)^2 P_{av}[\text{Watt}];$$

Eqn. (15)

where $Z_0$ is the characteristic impedance (typically 50Ω) of the input power source, f is the operating frequency, $C_t$ is the diode total capacitance, and $P_{av}$ is the maximum available power, $V_g^2/4Z_0$ (watt). These equations are under the matched condition. In addition, a peak RF voltage and current applied at the PIN diode switch is given by:

$$I_P = \sqrt{\frac{2P_{av}}{Z_0}}[A],$$
$$V_P = \sqrt{8Z_0 P_{av}}[V].$$

Eqn. (16)

PIN diodes, like most diodes, are nonlinear devices in their response characteristics, and as a result, they produce harmonics and intermodulation distortion (IMD). Fortunately, these products are usually at very low levels in a PIN diode switch because the diodes themselves are either in a saturated, forward-biased condition or are reversed-biased.

As mentioned above, components to be used in MRI systems are subjected to severe requirements, such as high power handling capability (~kW range), non-magnetic property. Thus, it is desirable to select a non-magnetic property, the high power capability, and the low series loss component. For example, this diode may be designed for 53 dBm RF continuous wave input power, 150 mA forward DC current driving, −800V reverse DC voltage, 0.7 pF maximum total capacitance, and 0.8Ω maximum series resistance.

Regarding the driver for the PIN diodes, a fundamental property of PIN diodes is their ability to control large RF signals with much lower values of DC current and voltage using two states of PIN diode driving circuits in which either a forward bias current or a reverse bias voltage. Therefore, a pull up driving circuit for the positive bias (+V) and a pull down driving circuit for the negative bias (−V) can be used. Both driving circuits may be toggled between +V and −V without the overlapped time. In reverse bias condition, the instantaneous voltage (both RF and DC bias) across the PIN diode should not exceed its reverse breakdown voltage supplied by manufacturers. If the RF voltage swing exceeds this voltage, the driver should have sufficient reverse bias current capability to achieve the desired switching speed, but it should also provide the excess reverse current required during the high power RF pulse. Under this reverse biased leakage condition, the PIN diode may heat appreciably causing an increase in the leakage current. If the leakage current is large enough, thermal runaway will cause the PIN diode to be destroyed.

In many applications, high applied reverse bias voltages are often problematic part to implement. Fortunately, the practical reverse bias does not require a full reverse bias (Vbias) condition to keep the safe switching region. That is, the requirement of the reverse bias voltage is less than the peak RF voltage, and the relationship between the reverse bias voltage and the intrinsic layer of PIN diode can be readily determined.

Turning now to the RF power monitoring system 502, the main control circuit uses the information made by sampling RF power from the main RF signal path, and manipulates matching and tuning capacitor (and/or inductor) arrays based on PIN diode switch circuits to find the optimal switching combination. In the power measurement, the first term for the reflected power measurement is a reflection coefficient, usually denoted by the symbol gamma (Γ), is given by:

$$|\Gamma| = \frac{V_{reflected}}{V_{forward}} = \frac{Z_L - Z_0}{Z_L + Z_0}.$$

Eqn. (17)

This represents the ratio of the reflected signal voltage to the forwarded signal voltage, and also expressed by the impedances between the load and source. Some RF power is reflected and Γ becomes greater than zero if $Z_{in}$ is not matched the impedance of the RF source (power amplifier), typically 50Ω.

Two more useful expressions are commonly used to describe the reflection measurement: VSWR (Voltage Standing Wave Ratio) and Return Loss (RL):

$$VSWR = \frac{V_{max}}{V_{min}} = \frac{1 + |\Gamma|}{1 - |\Gamma|};$$

Eqn. (18)

and $$RL = -20\log|\Gamma| = -20\log\frac{VSWR - 1}{VSWR + 1}.$$

Eqn. (19)

The ratio of the maximum to minimum voltage is known as VSWR, and a measure of how well matched a RF source (power amplifier) is to a RF coil element with a simple unit. The return loss is the measurement in dB of the ratio between the forward and reflected power. For example, a RF coil element with a VSWR of 2:1 would have a reflection coefficient of 0.33, a return loss of 9.5 dB, and about 11 percent of power loss. If 1 kW (60 dBm) is applied to this RF coil element, the return loss would be 9.5 dB. Therefore, 111 watts would be reflected and the rest 889 watts would be transmitted to generate B1 fields. In this case, the reflected 111 watts should not be ignored, and an impedance matching can be used to reduce the reflection power. In general, RF coils of MRI system should have at least VSWR of 1.2 (≈−20 dB in the reflection coefficient) to keep the proper matching condition. The VSWR can be checked on the Smith chart by S11 measurements in a network analyzer. The ratio of Vmax to Vmin becomes larger as the reflection coefficient increases. That is, if the ratio of Vmax to Vmin is one, then there is no variation in VSWR, and the impedance of the RF coil is perfectly matched to the RF source. If the ratio of Vmax to Vmin is greater than unity, then there is a signal fluctuation that makes the VSWR. In the power measurement circuit respect, these VSWR signals are used to generate DC output voltages with a rectifier circuit. In other words, the RF power detection circuit offers the reference level when VSWR=1, and the DC output of this circuit is a linear function with the VSWR levels.

For power measurement, RF input signals (i.e. VSWR signals in case of the power monitoring circuit) enter the power detect circuit that may include a diode (typically Schottky diode), a reactive component (capacitor and/or inductor), and a resistor. Schottky diodes are characterized by fast switching times, low forward voltage drop, and low junction capacitance. This Schottky diode detector is a basic simple rectifier circuit which produces an almost DC output current or voltage that is proportional to the magnitude of the alternating input signal. In this circuit, the Schottky diode rectifies the input alternating signal and charges the output capacitor.

Figure 14:
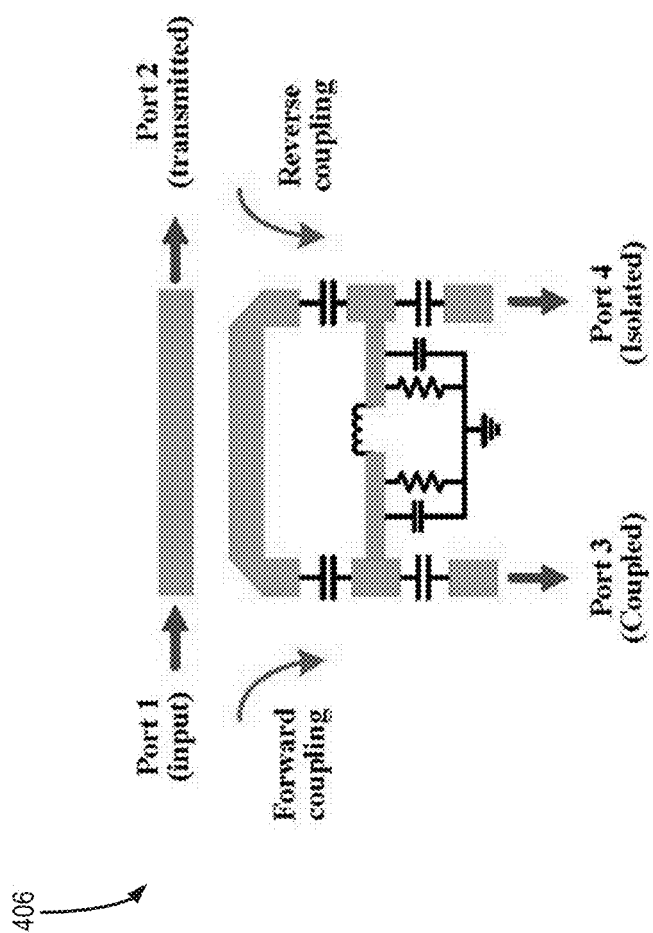
FIG. 14 is a flow chart setting for the steps of an exemplary process for automatically matching and tuning an RF coil or antenna in accordance with the present invention.

Regarding the design of the coupler 406, it may tap off a sample signal of the input power without significantly affecting the main signal path. An example of a coupler is provided in FIG. 14. The coupler 406 may have, for example, 4 ports, and some parameters are defined as follows:

$$\text{Coupling\_Factor} = 10\log\frac{P_{port3}}{P_{port1}} [dB];\quad\text{Eqn. (20)}$$

$$\text{Directivity} = 10\log\frac{P_{port4}}{P_{port3}} [dB];\quad\text{Eqn. (21)}$$

and $$\text{Isolation} = 10\log\frac{P_{port4}}{P_{port1}} [dB].\quad\text{Eqn. (22)}$$

The coupling factor is the ratio of the coupled output power to the input power. This is a negative number in dB, and the fundamental specification of couplers. In scattering matrix, this is S13=S31 in the forward direction and S24=S42 in the reverse direction. The directivity is the ratio of the power out of the coupling port to the power out of the isolation port, in dB. This is how effective the coupler has the independency between the coupled and an isolated port. Higher directivity is better performance of couplers. The isolation is the ratio of the input power to the power out of the isolation port, in dB. It indicates S14=S41 in the forward direction and S23=S32 in the reverse direction. In practice, it is not practical to build a perfect coupler, and some amounts of unintended power exist in the ports.

To support a power monitoring circuit, directivity is useful parameter. That is, both the coupled port and the isolated port must be separated with a proper phase shift (e.g. 90 degrees). In fact, Directivity=Isolation–Coupling factor in dB by equation (20)~equation (22), and a finite isolation is the reason for limited directivity. Power detector circuits measure the reflected signal indicating the reflected power by measuring the output of a bi-directional coupler at the coupled port. This output can be affected by the coupling factor, and the relative amplitude/phase difference between the reflected signal and signal present due to directivity make very complicated signals in the bi-directional coupler. Thus, it is hard to measure the pure power component from the coupler. The high accuracy of power measurement circuits can be obtained with a high directivity coupler.

Figure 15:
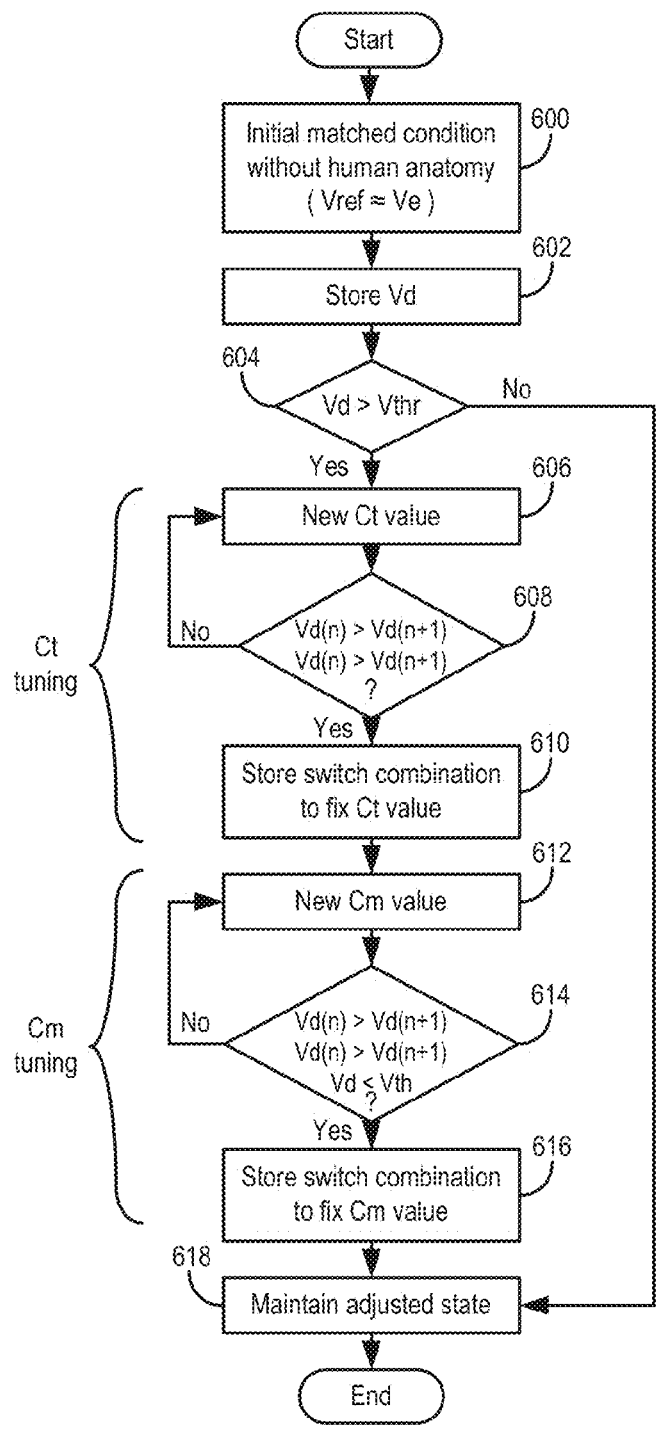
FIG. 15 is another flow chart setting for the steps of an exemplary process for automatically matching and tuning an RF coil or antenna in accordance with the present invention.

In the coupler design of the automatic matching and tuning unit, there are some desirable constraints that include a main signal line carrying high power RF signals, a small size to fit a RF coil dimension, and a good coupled signal generation at the coupled port. Since the operating frequency is 300 MHz at 7 T, λ/4 wavelength for a coupler design is about 25 cm. To meet these constraints, the fundamental concepts have been modified and a new coupler with lumped elements has been designed without affecting a main signal line but with high directivity as shown in FIG. 15. This coupler is adapted to monitor the RF power resulting from the RF coil's impedance mismatch condition. In this example, the coupled output of this coupler is connected to the input of the aforementioned power measurement circuit and then the DC voltage output is generated according to the coupled RF power level depending on the loading condition. That is, a heavy load condition makes voltage output higher.

In the overall operation of the system 500, there are two general steps. The first step is an automatic tuning/match procedure with the moderate power level, such as less than 20 dBm, and the second step is the same with a normal MRI scanner operation with the high power (up to 1 kW) to take MR images. In the first step, the output of RF power detector represents the reflected power level through the RF coupler for the power monitoring circuit at the input of the RF coil. From this information, the main control and decision block decides the optimum condition that is the impedance is matched to 50Ω, and the frequency is tuned to the Larmor frequency, regardless of the load (patient) conditions. The reactance-arrays with PIN diodes are built with the microstrip Pi matching circuit 432, and the control system 504 electrically drives PIN diodes to turn on or off through PIN diode driver circuits 412 during searching the optimum impedance matching/tuning condition. Once the control system 504 keeps the final results, the RF switch turns off 502 all circuits except for the essential part to drive PIN diodes. The purpose of this step is to protect the circuitry operated with the low power domain. As a result, this system 500 automatically works for the impedance matching and tuning and, thus the time-consuming manual re-tuning/matching is not required.

Referring to FIG. 15, a flowchart is provided setting forth steps of an example of a method for frequency tuning and impedance matching in accordance with the present invention, for example, using a system such as described with respect to FIG. 8. As will be described, variations on the system such as described with respect to FIG. 8, for example, such as described with respect to FIG. 13 can utilize similar methods.

Referring to FIG. 15, the process starts under unloaded conditions at process block 600 and the output of mismatch detection ($V_d$) is stored at process block 602 under those initial matched condition without human anatomy. The output of mismatch detection ($V_d$) is compared to a threshold (Vthr) at decision block 604. If $V_d$ is less than Vthr, the tuning is already matched.

However, if $V_d$ is greater than Vthr, $C_t$ tuning and $C_m$ tuning are performed. As illustrated, this tuning may be performed sequentially, beginning by selecting a new $C_t$ value at process block 606 for the $C_t$ tuning steps; however, other tuning steps or orders of steps may be used. At decision block 608, the desired switch combination of $C_t$ array block for new $C_t$ values are selected until the output of mismatch detection ($V_d$) is minimal, whereby a new $C_t$ value is updated at process block 610. The first in the $C_m$ tuning steps begins by selecting a new $C_m$ value at process bock 612. Decision block 614 causes the minimum output to be searched like $C_t$ tuning plus monitoring the output level related to the threshold to determine a matching condition. If the output of mismatch detection satisfies the minimum and the threshold condition, the automatic tuning control block decides that an overall matching condition is met, stores the $C_m$ value at process block 616 and retains this desired state of match at process block 618.

Figure 16:
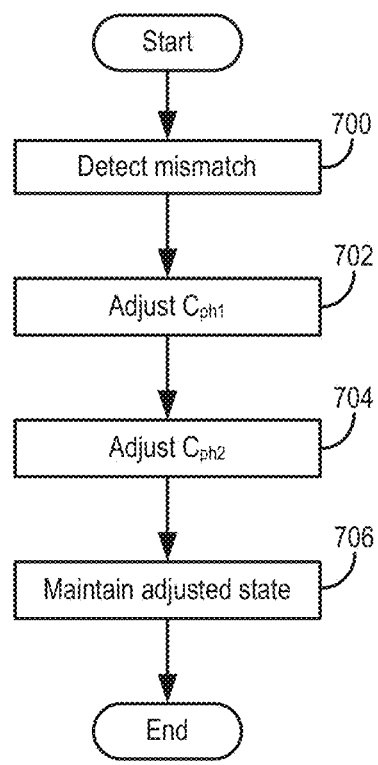
FIG. 16 is a flow chart setting forth the steps of a processes that can be implemented using a system, such as illustrated in FIG. 13 that includes a Pi matching circuit and other components.

Referring to FIG. 16, the above-described processes can likewise be implemented using a system, such as illustrated in FIG. 13 that includes a Pi matching circuit and other components. Generally, a process for frequency tuning and impedance matching begins by detecting a need or mismatch, such as indicated at process block 700. Upon detecting the need or mismatch, at process block 702, capacitor $C_{ph1}$, such as illustrated in FIG. 13, can be adjusted and, likewise, at process block 704, capacitor $C_{ph2}$ can be adjusted. Notably, the adjustments made with reference to process block 702 and 704 can be done in series or parallel. With adjusting completed to provide the desired frequency tuning and impedance matching, the system is controlled, at process block 706, to maintain the system performance at the desired frequency tuning and impedance matching.

It can be difficult to obtain high quality images in ultra-high-field MRI system unless impedance matching is fulfilled. The present invention provides a system and method for automatic tuning of RF coil circuits using a mismatch detector, matching array block, and control block. It provides fast tuning and matching procedures, robust performance regardless of anatomy types, and a structure that can be integrated a small board or semiconductor chip.

The above-described systems and methods provide automatic and highly-accurate frequency tuning and impedance matching. However, the above-described systems and methods can also be used to perform other tasks. For example, the above-described systems and methods can be used to isolate transmit and receive operations of an RF system, for example, when performing imaging techniques, where it could be advantageous to dynamically adjust the phase angle to maintain quadrature operation for continuous transmit and receive techniques, such as a continuous steering resonance over the object (cSTEREO) or continuous mode sweep imaging with Fourier transformation (cSWIFT) for imaging and spectroscopy studies, such as described in Idiyatullin, Djaudat, et al. "Continuous SWIFT." Journal of Magnetic Resonance (2012), which is incorporated herein by reference in its entirety. Resolution in the millisecond range is desirable to compensate for motion, such as respiration and the present invention is designed to advantageously provide automatic control capabilities, such as described above.

The present invention has been described in terms of one or more preferred embodiments, and it should be appreciated that many equivalents, alternatives, variations, and modifications, aside from those expressly stated, are possible and within the scope of the invention. Therefore, the invention should not be limited to a particular described embodiment.

The invention claimed is:

1. A radio-frequency (RF) system for use with a magnetic resonance imaging (MRI) system during a imaging process of a subject, the RF system comprising:
    a radio frequency (RF) element configured to at least one of transmit RF energy to and receive RF energy from the subject during the medical imaging process;
    an array of reactive components coupled to the RF element and configured to adjust at least one of an impedance transformation and a frequency tuning associated with the RF element;
    a mismatch detector circuit configured to measure a reflected signal from the RF element using a coupler including a coupling port and an isolated port separated by a desired phase shift providing isolation therebetween; and
    a feedback circuit configured to receive an indication of the reflected signal from the mismatch detector circuit and automatically determine at least one of an impedance adjustment and a frequency tuning to be implemented by adjusting the array of reactive components based on the reflected signal to effectuate transmit-receive isolation.

2. The system of claim 1 wherein the mismatch detector includes a directional coupler configured to sense the reflected signal.

3. The coil assembly of claim 1 further comprising a control system configured to receive the at least one of the impedance adjustment and the frequency tuning from the feedback circuit and change a total reactance of the array of reactive components based thereon.

4. The system of claim 3 further comprising a diode driver system configured to be controlled by the control system to change the total reactance of the array of reactive components.

5. The system of claim 1 wherein the array of reactive components forms part of a Pi matching circuit.

6. A method for automatically controlling operation of a radio frequency (RF) element for use with a magnetic resonance imaging (MRI) system, the method comprising the steps of:
    (a) determining at least one of a frequency tuning need and an impedance matching mismatch;
    (b) determining a desired performance of the RF element including a desired isolation between transmit and receive functionality of the RF element to be achieved by reducing the at least one of a frequency tuning need and an impedance matching mismatch;
    (c) adjusting at least one reactive component coupled to the RF element to reduce the at least one of frequency tuning need and impedance matching mismatch based on the desired performance of the RF coil element and achieve the desired isolation between transmit and receive functionality of the RF element; and
    (d) repeating step (c) during an MRI process using the RF coil element to control the at least one of frequency tuning need and impedance matching mismatch and the desired isolation based on the desired performance of the RF element despite loading condition changes during the MRI process.

7. The method of claim 6 wherein step (c) includes automatically changing a resonance frequency of the RF element by adjusting a reactance of the at least one reactive component and the desired performance includes matching the resonance frequency of the RF element to a desired Larmor frequency.

8. The method of claim 6 wherein the RF element includes a transmission line element and the at least one reactive component includes at least one capacitor coupled thereto and configured to adjust at least one of tuned condition and a matched condition of the RF element.

9. The method of claim 6 wherein step (c) includes automatically changing an impedance matching condition of the RF element by adjusting a capacitance of a reactive component and the desired performance includes matching to a desired loading condition of the RF element.

10. The method of claim 6 wherein step (b) includes automatically determining a reduced reflection coefficient at a desired Larmor frequency to determine the at least one of a frequency tuning need and an impedance matching mismatch.

11. The method of claim 6 further comprising adjusting at least one reactive component coupled to the RF coil element based on changes in operation of the RF coil between a transmit operational mode and a receive operational mode.

12. A system for automatically adjusting electrical performance of a radio frequency (RF) system of a magnetic resonance imaging (MRI) system during a medical imaging process of a subject, the system comprising:
  an adjustment circuit coupled between the MRI system and the RF system;
  a coupler providing isolation between the MRI system and the RF system;
  a frequency detector circuit configured to measure a resonance frequency from the RF system;
  a feedback circuit configured to receive an indication of the resonance frequency from the frequency detector circuit and determine at least one of a frequency tuning need and a impedance matching mismatch using the resonance frequency; and
  a control circuit configured to control operation of the adjustment circuit to implement at least one of frequency tuning adjustments and impedance matching adjustments to control changes in the resonance frequency at least caused by changes in loading conditions of the RF system caused by the subject during the medical imaging process.

13. The system of claim 12 wherein the feedback circuit includes a directional coupler configured to sense a reflected signal from the RF system.

14. The system of claim 12 wherein the adjustment circuit includes an array of reactive components coupled to the RF system and wherein the control circuit is configured to change a reactive parameter of the adjustment circuit to control changes in the resonance frequency from the RF system at least caused by changes in loading conditions of the RF system caused by the subject during the medical imaging process.

15. The system of claim 14 wherein the array of reactive components forms part of a Pi matching circuit.

16. The system of claim 12 further comprising a diode driver system configured to be controlled by the control circuit to control operation of the adjustment circuit.

17. The system of claim 12 wherein the medical imaging process includes at least one of a continuous mode sweep imaging with Fourier transformation (cSWIFT) and a continuous steering resonance over the object (cSTEREO) imaging process.

18. The system of claim 12 wherein the control circuit is configured to control operation of the adjustment circuit to automatically control changes induced by changing in loading conditions of the RF system caused by the subject during the medical imaging process.

19. The system of claim 12 wherein the RF system includes a transmission line element.

20. The system of claim 12 wherein the adjustment circuit, frequency detector circuit, feedback circuit, and control circuit form a coil element control circuit and the RF system further comprises a plurality of coil element with associated control circuits, each control circuit configured to connect to a respective coil element of the RF system to control changes induced by changes in loading conditions of each coil element in the RF system caused by the subject during the medical imaging process.

21. The system of claim 12 wherein the RF system includes at least one of an RF coil and an RF antenna.

22. A radio-frequency (RF) system for use with a magnetic resonance imaging (MRI) system during a imaging process of a subject, the RF system comprising:
  a radio frequency (RF) element configured to transmit RF energy to and receive RF energy from the subject during the medical imaging process;
  an array of reactive components coupled to the RF element to perform a parallel imaging process;
  a diode system configured to provide electrical isolation between components of the RF stem and adjust parameters of the reactive components to perform at least one of an impedance matching and a frequency tuning of the RF element; and
  a control circuit configured to control the diode system to adjust parameters of the reactive components.

23. The system of claim 22 further comprising a feedback circuit including a directional coupler configured to measure a reflected signal from the RF element and wherein the control circuit is configured to use the measure of the reflected signal to automatically control the diode system to adjust parameters of the reactive components.

24. The system of claim 22 wherein the array of reactive components forms part of a Pi matching circuit.

* * * * *

UNITED STATES PATENT AND TRADEMARK OFFICE
CERTIFICATE OF CORRECTION

PATENT NO. : 9,500,727 B2  
APPLICATION NO. : 13/868014  
DATED : November 22, 2016  
INVENTOR(S) : Sung-Min Sohn et al.

Page 1 of 1

It is certified that error appears in the above-identified patent and that said Letters Patent is hereby corrected as shown below:

In the Specification

Column 1, Line 32, "process" should be --precess--.

Column 8, Line 44, "ND" should be --A/D--.

In the Claims

Column 22, Claim 22, Line 33, "stem" should be --system--.

Signed and Sealed this
Seventh Day of February, 2017

Michelle K. Lee
*Director of the United States Patent and Trademark Office*